United States Patent
Son et al.

(10) Patent No.: US 8,482,989 B2
(45) Date of Patent: Jul. 9, 2013

(54) SEMICONDUCTOR DEVICE INCLUDING FUSE ARRAY AND METHOD OF OPERATION THE SAME

(75) Inventors: Jong-pil Son, Seongnam-si (KR);
Seong-jin Jang, Seongnam-si (KR);
Byung-sik Moon, Seoul (KR); Ju-seop Park, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/295,484

(22) Filed: Nov. 14, 2011

(65) Prior Publication Data
US 2012/0120733 A1 May 17, 2012

(30) Foreign Application Priority Data

Nov. 15, 2010 (KR) .................. 10-2010-0113488

(51) Int. Cl.
*G11C 7/00* (2006.01)

(52) U.S. Cl.
USPC ............ 365/189.02; 365/189.17; 365/189.15; 365/189.12; 365/225.7

(58) Field of Classification Search
USPC ............. 365/189.02, 189.17, 189.15, 189.12, 365/225.7
See application file for complete search history.

(56) References Cited

U.S. PATENT DOCUMENTS

| 5,677,917 | A  | * | 10/1997 | Wheelus et al. ............. 714/726 |
| 5,859,801 | A  | * | 1/1999  | Poechmueller ............... 365/200 |
| 6,445,627 | B1 | * | 9/2002  | Nakahara et al. ............. 365/200 |
| 6,493,414 | B1 | * | 12/2002 | Callahan ......................... 377/69 |
| 6,717,877 | B2 | * | 4/2004  | Suzuki et al. ............. 365/210.12 |
| 6,876,586 | B1 | * | 4/2005  | Hausmann ............... 365/189.12 |
| 7,106,642 | B2 | * | 9/2006  | Hojo ............................. 365/200 |
| 7,134,057 | B1 | * | 11/2006 | Kaushik et al. ............... 714/711 |
| 7,266,025 | B2 | * | 9/2007  | Nagai et al. .................. 365/200 |
| 7,402,855 | B2 |   | 7/2008  | Kurjanowicz |
| 7,460,421 | B2 | * | 12/2008 | Kohara ......................... 365/200 |
| 7,795,899 | B1 | * | 9/2010  | Grohoski et al. ................. 326/8 |
| 2009/0096060 | A1 |   | 4/2009  | Kim et al. |
| 2010/0127731 | A1 |   | 5/2010  | Seo et al. |

FOREIGN PATENT DOCUMENTS

KR 1020100060149 6/2010

* cited by examiner

*Primary Examiner* — Viet Q Nguyen
(74) *Attorney, Agent, or Firm* — Onello & Mello, LLP

(57) ABSTRACT

Provided are a semiconductor device including a fuse and a method of operating the same. The semiconductor device includes a fuse array, a first register unit, and a second register unit. The fuse array includes a plurality of rows and columns. The first register unit receives at least one row of fuse data from the fuse array. Fuse data of the at least one row of fuse data is received in parallel by the first register unit. The second register unit receives the fuse data at least one bit at a time from the first register unit.

13 Claims, 22 Drawing Sheets (a)                 (b)

FIG. 3
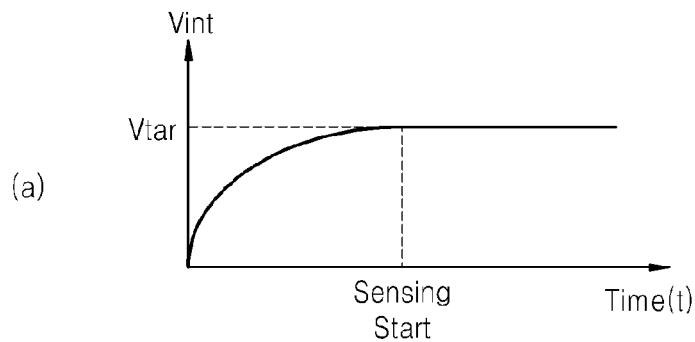
(a)
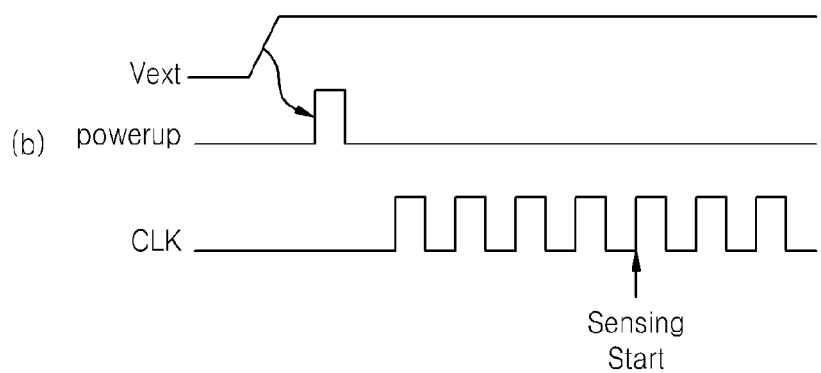
(b)
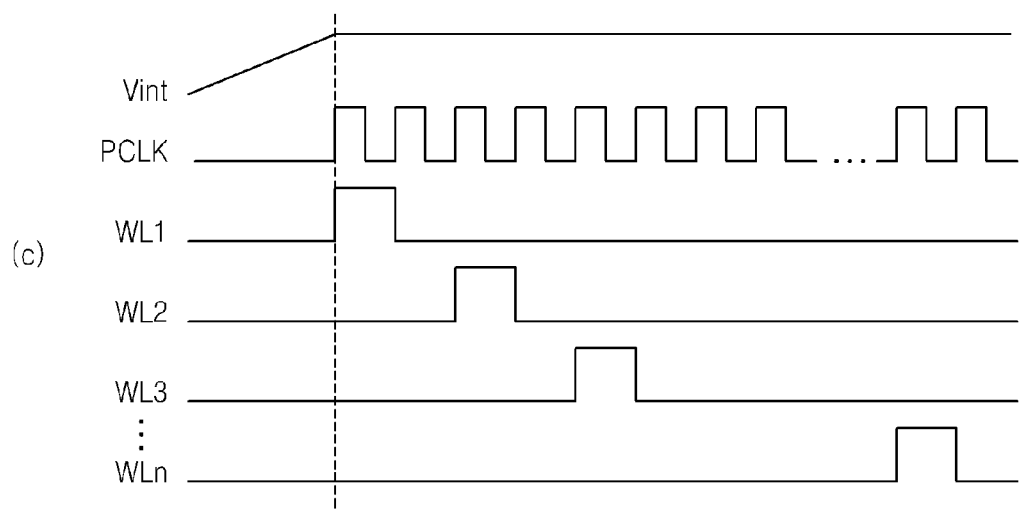
(c)

SEMICONDUCTOR DEVICE INCLUDING FUSE ARRAY AND METHOD OF OPERATION THE SAME

CROSS-REFERENCE TO RELATED APPLICATIONS

This application claims the benefit of Korean Patent Application No. 10-2010-0113488, filed on Nov. 15, 2010, in the Korean Intellectual Property Office, the disclosure of which is incorporated herein in its entirety by reference.

BACKGROUND

The inventive concepts relate to a semiconductor device and a method of operating the same, and more particularly, to a semiconductor device including a fuse array and a method of operating the same.

A modern semiconductor device used in a computer, a mobile device, or the like is highly integrated and offers many different functions. The capacity and speed of a memory device, for example, a semiconductor device, continue to increase. This is due in part to such devices including a memory cell having a capacity for storing more information, while being configured for a smaller semiconductor device. Various attempts have been made to improve operations performed by a semiconductor device.

As a memory cell having a higher capacity is integrated in a semiconductor device, the amount of information which is previously set and stored in order to set an operating environment of the semiconductor device has also increased. In order to store various pieces of information for setting an operating environment of a semiconductor device, technologies related to a fuse circuit can be applied. The fuse circuit can be a laser fuse circuit having a connection controlled by laser radiation, an electrical fuse circuit having a connection controlled by an electrical signal, or an antifuse circuit which changes from a high resistance state to a low resistance state. However, as the amount of information related to an operating environment of a semiconductor device continues to increase due to technological advances, the size of a fuse circuit likewise continues to increase, and the number of storage circuits, such as registers for storing information read from the fuse circuit, likewise continues to increase.

SUMMARY

The inventive concepts relate to a semiconductor device and a method of operating the same which can prevent the number of storage circuits from increasing as the size of a fuse circuit increases and prevent the degree of design complexity of the semiconductor device from increasing as the number of storage circuits increases.

According to an aspect of the inventive concepts, there is provided a semiconductor device including a fuse array that comprises a plurality of rows and columns; a first register unit that receives at least one row of fuse data from the fuse array, wherein fuse data of the at least one row of fuse data is received in parallel by the first register unit; and a second register unit that receives the fuse data at least one bit at a time from the first register unit.

In an embodiment, the fuse array comprises m rows and n columns, wherein the first register unit comprises a*n registers and stores fuse data of a row of the fuse array (m, n, and a are each an integer equal to or greater than 1), and wherein fuse data stored in one row of the a rows is output in parallel to the first register unit.

In an embodiment, the second register unit comprises m*n registers and stores the fuse data of the m rows of the fuse array.

In an embodiment, the fuse array include antifuses, and each antifuse comprises one fuse transistor connected to a high voltage and one select transistor connected to a word line and a bit line, wherein it is determined whether each of the antifuses is programmed according to voltage levels of at least one of the high voltage, the word line, and the bit line.

In an embodiment, the semiconductor device comprises a cell region in which a memory cell array is disposed and a peri region in which one or more peripheral circuits are positioned, wherein the fuse array is positioned at the peri region and at least one register of the second register unit is positioned at the cell region.

In an embodiment, when the semiconductor device is initially driven, a read operation of the fuse array is initiated by sensing whether a level of an internal voltage reaches a threshold value.

In an embodiment, the semiconductor device further comprises an address generating unit that generates a row address for driving rows of the fuse array, wherein one or more rows of the fuse array is masked to disable a corresponding row address.

In an embodiment, the semiconductor device further comprises a masking circuit that is positioned to correspond to one or more registers of the second register unit, wherein the fuse data is prevented from being provided to the some registers while the masking circuits are enabled.

In accordance with another aspect of the inventive concepts, there is provided a semiconductor device including: a fuse array that includes m rows and n columns; a first register unit that comprises a*n registers and stores fuse data of a rows of the fuse array; a second register unit that comprises m*n registers, the second register unit receiving the fuse data from the first register unit and storing the fuse data of the m rows of the fuse array; and one or more circuit blocks that receives the fuse data from the second register unit, and performs a setting operation in response to receiving the fuse data (where m, n, and a are each an integer equal to or greater than 1).

In an embodiment, the one or more circuit blocks comprises a plurality of circuit blocks that perform the setting operation, wherein the second register unit comprises a plurality of register blocks and each of the plurality of register blocks is adjacent a circuit block corresponding to each of the plurality of register blocks.

In an embodiment, the first register unit comprises an odd register unit that comprises n registers and an even register unit that comprises n registers, wherein the odd register unit sequentially stores fuse data of odd rows of the fuse array, and the even register unit sequentially stores fuse data of even rows of the fuse data.

In an embodiment, the first register unit further comprises a multiplexer that selectively outputs fuse data from the odd register or the even register.

In an embodiment, the semiconductor device further comprises a sense amplifier unit that comprises a plurality of sense amplifier circuits positioned between the fuse array and the first register unit, wherein an odd sense amplifier circuit and an even sense amplifier circuit are disposed to correspond to each of columns of the fuse array.

In an embodiment, the first register unit receives in parallel fuse data in rows from the fuse array, and wherein the second register unit sequentially receives the fuse data from the first register unit at least one bit at a time.

In an embodiment, the semiconductor device further comprises a memory cell array that stores data, wherein each of the one or more circuit blocks comprises an address comparing unit that replaces a defective cell of the memory cell array with a redundant cell, and wherein fuse data of one or more registers of the second register unit is provided to the address comparing unit.

In an embodiment, the memory cell array, the address comparing unit and at least one register of the second register unit are positioned at a cell region of the semiconductor device, and the fuse array and the first register unit are positioned outside the cell region.

In an embodiment, the fuse array comprises a plurality of antifuses that are positioned in an array.

According to another aspect of the inventive concepts, there is provided a method of operating a semiconductor device comprising a plurality of fuses, wherein the plurality of fuses are configured in an array comprising a plurality of rows and columns, the method comprising accessing the fuse array and reading information stored in the fuse array; storing in parallel fuse data in a first register unit, the fuse data read from the information stored in the fuse array, the fuse data received in parallel by the first register unit as a row of fuse data; sequentially transmitting the fuse data stored in the first register unit to a second register unit at least one bit of the row of fuse data at a time; and setting an operating environment of the semiconductor device by processing the fuse data stored in the second register unit.

In an embodiment, the method further comprises supplying power to the semiconductor device; and detecting a level of an internal voltage of the semiconductor device, wherein when the level of the internal voltage reaches a threshold value, the reading of the information is initiated.

In an embodiment, the fuse array comprises m rows and n columns, wherein the first register unit comprises a*n registers and stores fuse data of a rows of the fuse array, and wherein the second register unit comprises m*n registers and stores fuse data of the rows of the fuse array (where m, n, and a are each an integer equal to or greater than 1).

In an embodiment, the method further comprises generating a plurality of row addresses in order to drive the rows of the fuse array, wherein at least some of the plurality of row addresses are disabled in response to preset masking information.

In an embodiment, the fuse array comprises a plurality of antifuses positioned in an array.

According to another aspect of the inventive concepts, there is provided a semiconductor device comprising a fuse array comprising a plurality of fuses, the fuses storing data for performing an operation related to the semiconductor device; a first register unit that receives a row of the data and outputs in a sequential order a predetermined number of bits of the row of data to a second register unit; and the second register unit that temporarily stores the received bits of the row of data, and outputs the bits to perform the operation.

In an embodiment, the fuses include antifuses.

In an embodiment, the semiconductor device further comprises a sense amplifier that receives, senses, and amplifies the row of the data stored in a corresponding row of the fuses of the fuse array and outputs the amplified data to the first register unit.

In an embodiment, the predetermined number of bits is one bit.

In an embodiment, the predetermined number of bits is n bits, where n is greater than 1.

In an embodiment, the operation includes setting an operating environment of the semiconductor device.

BRIEF DESCRIPTION OF THE DRAWINGS

Exemplary embodiments of the inventive concepts will be more clearly understood from the following detailed description taken in conjunction with the accompanying drawings in which:

FIGS. 3A through 3C are timing diagrams corresponding to a read operation of an antifuse array of the semiconductor device of FIG. 1;

DETAILED DESCRIPTION OF THE EMBODIMENTS

Figure 1:
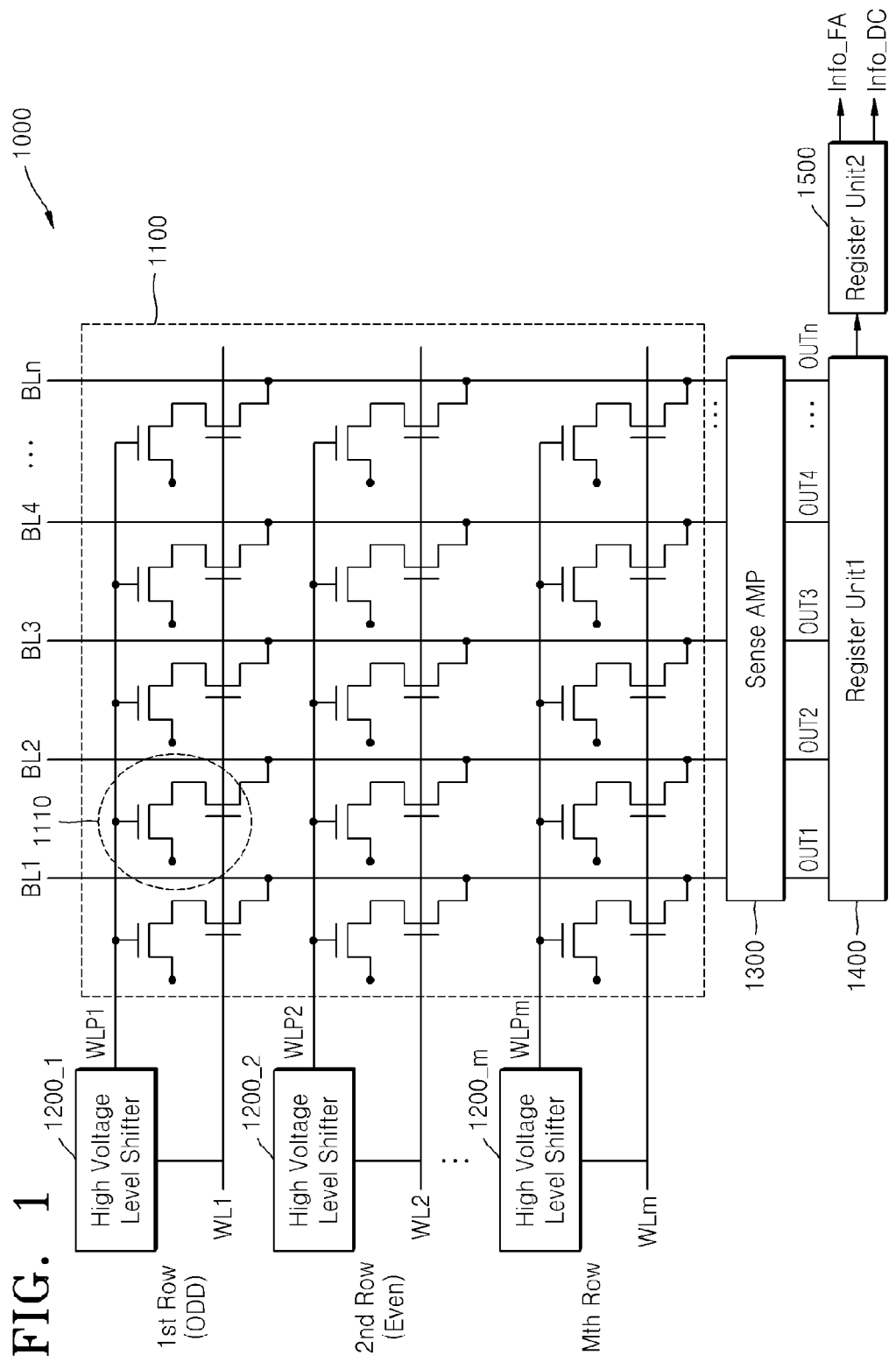
FIG. 1 is a block diagram illustrating a semiconductor device, according to an embodiment of the inventive concepts.

In order to fully understand operational advantages of the inventive concepts and objects to be attained by embodiments of the inventive concepts, the accompanying drawings illustrating exemplary embodiments of the inventive concepts and details described in the accompanying drawings should be referred to.

The inventive concepts will now be described more fully with reference to the accompanying drawings, in which exemplary embodiments of the inventive concepts are shown. In the drawings, the same reference numerals denote the same elements.

FIG. 1 is a block diagram illustrating a semiconductor device 1000 according to an embodiment of the inventive concepts. Referring to FIG. 1, the semiconductor device 1000 includes a fuse array 1100 in which a plurality of fuses 1110 are arranged, level shifters 1200_1 through 1200_m that generate high voltages for changing resistance states of the fuses 1110, and a sense amplifier unit 1300 that senses and amplifies information stored in the fuse array 1100. Also, in order to store fuse data generated by reading information stored in the fuse array 1100, a first register unit 1400 and a second register unit 1500 are included in the semiconductor device 1000. Each of the first register unit 1400 and the second register unit 1500 can be a shift register unit including a plurality of registers.

The fuse array 1100 includes the plurality of fuses 1110. Information can be stored at each of the plurality of fuses 1110. The fuse array 1100 can include laser fuses, each having a connection controlled by laser radiation, or electrical fuses, each having a connection controlled by an electrical signal. Alternatively, the fuse array 1100 can include antifuses. A feature of antifuses is that they can change from high resistance states to low resistance states when an electrical signal, for example, a high voltage signal, is applied. The fuse array 1100 can include one or more of the above-described types of fuses. The following explanation is provided based on the assumption that the fuse array 1100 includes antifuses. Information stored in each of the antifuses or data read from each of the antifuses can be referred to as fuse data.

The fuse array 1100, hereinafter referred to as antifuse array, has an array arrangement in which the fuses 1110, hereinafter referred to as antifuses, are disposed at intersections of a plurality of rows and a plurality of columns. For example, if the antifuse array 1100 includes m rows and n columns, the antifuse array 1100 includes m*n antifuses 1110. Word lines WL1 through WLm for accessing the antifuses 1110 are disposed at the m rows. Bit lines BL1 through BLn corresponding to the n columns are provided to transmit information read from the antifuses 1110.

The antifuse array 1100 stores various pieces of information for an operation to be performed at the semiconductor device 1000. For example, the antifuse array 1100 can store information for setting an operating environment of the semiconductor device 1000. Elements of the information can be programmed by applying voltage signals WLP1 through WLPm provided from the level shifters 1200_1 through 1200_m to the antifuse array 1100 to change states of the antifuses 1110. The antifuses 1110 are initially at high resistance states and are changed to low resistance states due to a programming operation to store the information, which is different than an operation including laser fuses or electrical fuses. Each of the antifuses 1110 can have a capacitor structure in which a dielectric layer is disposed between two conductive layers, and each of the antifuses 1110 is programmed by breaking down the dielectric layer by applying a high voltage between the two conductive layers.

After the antifuse array 1100 is programmed, the semiconductor device 1000 starts operating and a read operation can be performed from the antifuse array 1100. The read operation can be performed at the same time that the semiconductor device 1000 is driven, or can be performed a predetermined period of time after the semiconductor device 1000 is driven. During the read operation, word line select signals are provided through the word lines WL1 through WLm of the antifuse array 1100, and information stored in selected antifuses 1110 is provided to the sense amplifier unit 1300 through the bit lines BL1 through BLn. Due to the array arrangement, information of the antifuse array 1100 can be accessed at random by driving the word lines WL1 through WLm and the bit lines BL1 through BLn.

In an embodiment, as the word lines WL1 through WLm are sequentially driven, the antifuses 1100 are sequentially accessed in an order from the first row to the mth row of the antifuse array 1100. Information related to the sequentially accessed antifuses 1110 is provided to the sense amplifier unit 1300. The sense amplifier unit 1300 can include one or more sense amplifier circuits. There can be a 1-to-1 correspondence between the sense amplifier circuits and the columns of fuses. For example, where the antifuse array 1100 includes n columns as shown in FIG. 1, the sense amplifier unit 1300 includes n sense amplifier circuits corresponding to the n columns. The n sense amplifier circuits are connected to bit lines BL1 through BLn, respectively.

In an embodiment, two sense amplifier circuits are configured to correspond to one of the bit lines BL1 to BLn. For example, an odd sense amplifier circuit and an even sense amplifier circuit can correspond to the first bit line BL1. The odd sense amplifier circuits can sense, amplify, and output information of the antifuses 1110 connected to odd word lines WL1, WL3, WL5, and so on, and the even sense amplifier circuits can sense, amplify, and output information of the antifuses 1110 connected to even word lines WL2, WL4, WL6, and so on. However, the present embodiment is not limited thereto, and the sense amplifier circuits can be disposed in various other manners. For example, a single sense amplifier circuit can be disposed to correspond to one bit line, or three or more sense amplifier circuits can be disposed to correspond to one bit line.

The sense amplifier unit 1300 senses the information accessed in the antifuse array 1100. This information can be amplified, and output from the antifuse array 1100 to registers or related devices, described herein. The sensed and amplified information can include fuse data OUT1 through OUTn used to set an operating environment of the semiconductor device 1000. When two sense amplifier circuits are disposed to correspond to one bit line, one fuse data, for example, the first fuse data OUT1, can actually include odd fuse data and even fuse data.

The fuse data OUT1 through OUTn output from the sense amplifier unit 1300 is provided to the first register unit 1400. The first register unit 1400 can be a shift register unit including a plurality of registers which are connected in series to sequentially transmit signals. Also, the first register unit 1400 can include a number of registers that is lower than the number of antifuses 1110 included in the antifuse array 1100. Also, the number of registers included in the first register unit 1400 can be related to the number of columns of the antifuse array 1100. For example, if the antifuse array 1100 includes n columns, the first register unit 1400 can include n registers. Alternatively, as described above, if two sense amplifier circuits are disposed to correspond to one bit line, the first register unit 1400 can include 2*n registers.

The first register unit 1400 receives fuse data OUT1 through OUTn corresponding to a row of the antifuse array 1100. For example, if one row of the antifuse array 1100 is selected, fuse data OUT1 through OUTn from the antifuses 1100 connected to a word line of the selected row are provided in parallel to the first register unit 1400. The first register unit 1400 provides the fuse data OUT1 through OUTn to the second register unit 1500 by shifting bits of the fuse data OUT1 through OUTn. The second register unit 1500 can include a shift register unit comprising a plurality of registers which are connected in series to sequentially transmit signals. Also, the second register unit 1500 can include a number of registers that is the same as the number of antifuses 1110 in the antifuse array 1100. The fuse data OUT1 through OUTn stored in the second register unit 1500 can include information for setting an operating environment of the semiconductor device 1000. For example, some of the fuse data OUT1 through OUTn stored in the second register unit 1500 can be output as information Info_FA for replacing a memory cell (not shown) in the semiconductor device 1000 with a redundant memory cell. Other fuse data OUT1 through OUTn can be output as trimming information Info_DC for adjusting a level of a voltage generated in the semiconductor device 1000.

In order to store the fuse data OUT1 through OUTn from the antifuse array 1100, registers connected to the sense amplifier unit 1300 and adapted to temporarily store the fuse data OUT1 through OUTn are required. Also, registers disposed adjacent to various circuit blocks of the semiconductor device 1000, for example, row and column decoders and a DC voltage generator, for providing the fuse data OUT1 through OUTn to the circuit blocks, are needed.

According to an embodiment, the first register unit 1400 receives the fuse data OUT1 through OUTn from the sense amplifier unit 1300, and transmits the fuse data OUT1 through OUTn to the second register unit 1500 that is adjacent to the circuit blocks. In particular, since the antifuse array 1100 has an array arrangement and the first register unit 1400 includes registers in a number that corresponds to the number of columns included in the antifuse array 1100, the first register unit 1400 includes registers in a number that is lower than the total number of antifuses 1110 of the antifuse array 1100. For example, if one sense amplifier circuit is disposed to correspond to one bit line, the first register unit 1400 includes n sense amplifier circuits. Accordingly, the number of registers of the first register unit 1400 related to the fuse data OUT1 through OUTn can be n, instead of m*n. In particular, even when many antifuses 1110 are included in the antifuse array 1100, since the number of registers of the first register unit 1400 can be limited to n according to a structure of the antifuse array 1100, the number of registers can not be required to increase in proportion to the number of antifuses 1110.

Figure 2:
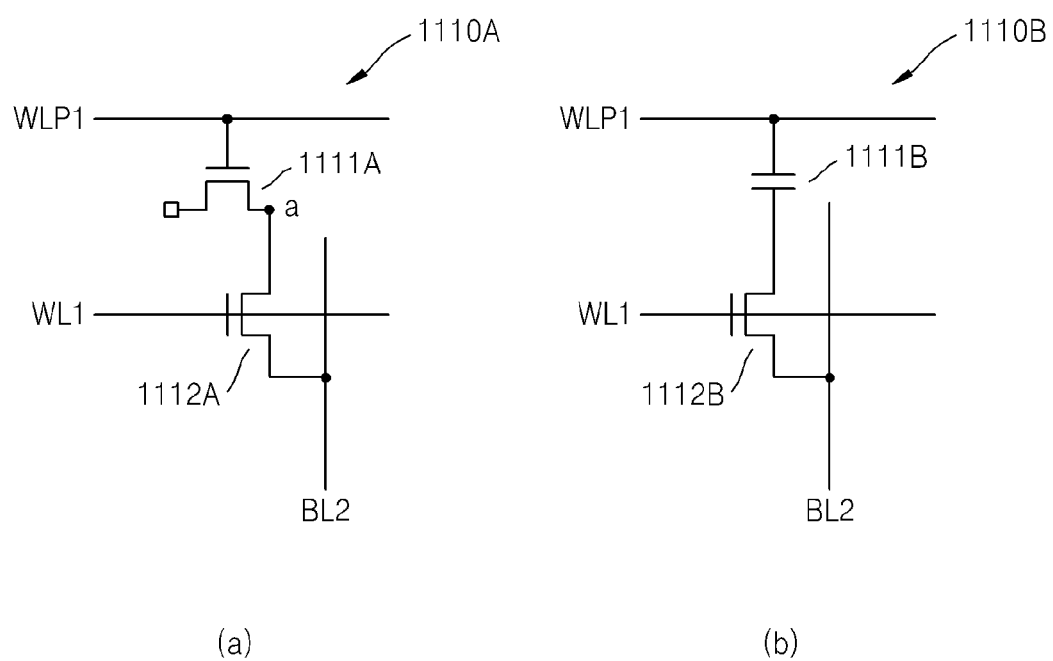
FIGS. 2A and 2B are circuit diagrams each illustrating a unit structure of an antifuse of the semiconductor device of FIG. 1.

FIGS. 2A and 2B are circuit diagrams each illustrating a unit structure of an antifuse 1110 of the semiconductor device 1000 of FIG. 1. FIG. 2A illustrates an example where an antifuse 1110A has a unit structure including one fuse transistor 1111A and one select transistor 1112A. FIG. 2B illustrates an example where an antifuse 1110B has a unit structure including one fuse capacitor 1111B and one select transistor 1112B.

Referring to FIG. 2A, the fuse transistor 1111A of the antifuse 1110A can be a metal-oxide-semiconductor field-effect transistor (MOSFET). A gate of the fuse transistor 1111A receives a high voltage signal WLP1, a first terminal of the fuse transistor 1111A is in a floating state, and a second terminal is connected to a first terminal of the select transistor 1112A. A gate of the select transistor 1112A is connected to a word line WL1 and a second terminal of the select transistor 1112A is connected to a bit line BL2. A breakdown operation of a dielectric layer (not shown) of the fuse transistor 1111A occurs according to the high voltage WLP1, a voltage signal of the word line WL1, and a voltage signal of the bit line BL2, and a programming operation is performed accordingly. In FIG. 2B, the fuse transistor 1111A of FIG. 2A is replaced with a fuse capacitor 1111B. A programming operation can also be performed by the fuse capacitor 1111B receiving the high voltage WLP1, a voltage of the word line WL1, and a voltage of the bit line BL2.

A programming operation of the antifuse array 1100 of FIG. 1 will be explained below with reference to Table 1 and FIG. 2A.

TABLE 1

| Program voltage | WLP | WL | BL |
| --- | --- | --- | --- |
| WL Sel, BL Sel | VPP (6 V) | 3 V | 0 V |
| WL Sel, BL Unsel | VPP (6 V) | 3 V | 3 V |
| WL Unsel, BL Sel | 0 V or 3 V | 0 V | 0 V |
| WL Unsel, BL Unsel | 0 V or 3 V | 0 V | 3 V |

In the antifuse array 1100, a programming operation can be performed according to bits of data stored in the antifuse array 1100. Conditions of a voltage signal for a programming operation can be set as shown in Table 1. A high voltage VPP can be provided to a selected antifuse, and the high voltage VPP can be 6 V. Also, 3V, which corresponds to VPP/2, is provided to a word line of the selected antifuse, and a bit line is precharged to 0 V. Also, a word line signal having a level of 0 V is provided to a word line of a non-selected antifuse, and a bit line is precharged to 3 V. Also, a voltage of 0 V or 3V is provided to a fuse transistor of the non-selected antifuse.

If the antifuse 1110A illustrated in FIG. 2A is selected, a high voltage WLP1 of 6 V is provided to the gate of the fuse transistor 1111A, and the select transistor 1112A is turned on according to a word line voltage of 3 V. Accordingly, a voltage (for example, a voltage between a gate and a node 'a') at both terminals of the fuse transistor 1111A is 6 V, and a programming operation of the fuse transistor 1111A is performed. On the other hand, under the above conditions of a voltage signal, a select transistor of a non-selected antifuse is turned off and thus the node 'a' is in a floating state. Accordingly, a programming operation for the non-selected antifuse is not performed.

A read operation of the antifuse array 1100 illustrated in FIG. 1 will be explained below with reference to Table 2 and FIG. 2A.

TABLE 2

| | Voltage |
| --- | --- |
| Select WLP | Vread |
| Select WL | Vext |
| Unsel WLP | 0 V |
| Unsel WL (0 V) | 0 V |

Information stored in the antifuse array 1100 can be read in the form of bits, and thus one word line is selected and remaining word lines are not selected. If the antifuse 1110A illustrated in FIG. 2A is selected, a voltage WLP having a general power voltage Vread is provided to the gate of the fuse transistor 1111A, and a word line voltage having a level of an external voltage Vext is provided to the gate of the select transistor 1112A. Also, during a read operation from the antifuse array 1100, all bit lines are precharged to 0 V, and 0 V is provided to gates of a select transistor and a fuse transistor of a non-selected antifuse. If the antifuse 1110A is programmed, a signal corresponding to logic high is transmitted through the bit line BL2. If the antifuse 1110A is not programmed, the bit line BL2 is maintained at 0 V and a signal corresponding to logic low is transmitted through the bit line BL2. Although programming and read operations are described herein, other operations known to those of ordinary skill in the art can equally apply.

FIGS. 3A through 3C are timing diagrams corresponding to a read operation of the antifuse array 1100 of FIG. 1. An operation of the semiconductor device 1000 will be explained below with reference to FIGS. 1 and 3A through 3C.

Referring to FIG. 3A, when the semiconductor device 1000 including the antifuse array 1100 is driven, an internal voltage Vint of the semiconductor device 1000 is increased to reach a target level $V_{tar}$. The semiconductor device 1000 includes a level sensing unit (not shown) for sensing a level of the internal voltage Vint, and performs various control operations for reading information of the antifuse array 1100 according to a result of the sensing. For example, if a read operation of the antifuse array 1100 starts when the internal voltage Vint reaches the target level Vtar at a sensing start time, operations for reading information of the antifuse array 1100 are performed based on a result of the sensing by the level sensing unit (not shown). For example, a circuit block (not shown) that generates a row address of the antifuse array 1100 is driven. Also, the level shifters 1200_1 through 1200_m, the sense amplifier unit 1300, the first and second register units 1400 and 1500, and so on are driven.

FIG. 3B illustrates a read operation of the antifuse array 1100 according to another embodiment of the inventive concepts. Referring to FIG. 3B, a read operation of the antifuse array 1100 can start based on a time when a clock signal CLK applied to the semiconductor device 1000 is transited. For example, an external voltage $V_{ext}$ is applied to the semiconductor device 1000, and a driving signal powerup for driving the semiconductor device 1000 is enabled in response to the external voltage $V_{ext}$. An externally applied clock signal CLK is provided to the semiconductor device 1000, and a read operation of the antifuse array 1100 of the semiconductor device 1000 can start in response to the number of times the clock signal CLK is transited after the driving signal powerup is enabled. FIG. 3B illustrates an example where a read operation of the antifuse array 1100 starts at a fifth rising edge of the clock signal CLK after the driving signal powerup is enabled.

FIG. 3C is a waveform diagram illustrating a word line signal for accessing the antifuse array 1100. Referring to FIG. 3C, when an internal voltage Vint reaches a target level $V_{tar}$, a clock signal PCLK can be generated by an oscillator (not shown) included in the semiconductor device 1000 and a word line signal can be generated due to the clock signal PCLK. Word lines are sequentially enabled in an order from a first word line WL1 to an mth word line WLm according to word line signals respectively provided to the word lines WL1 through WLm.

Figure 4A:
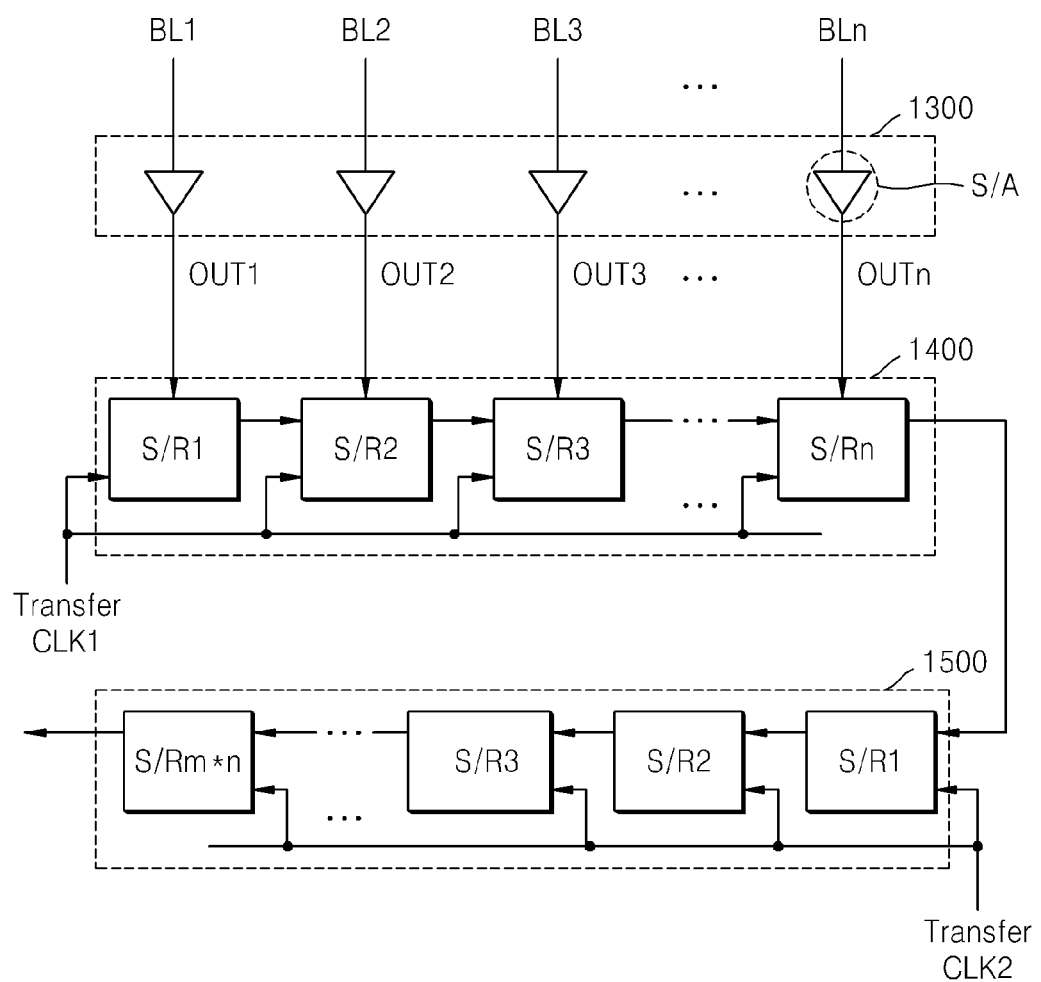
FIGS. 4A and 4B are block diagrams illustrating first and second register units of the semiconductor device of FIG. 1.
Figure 4B:
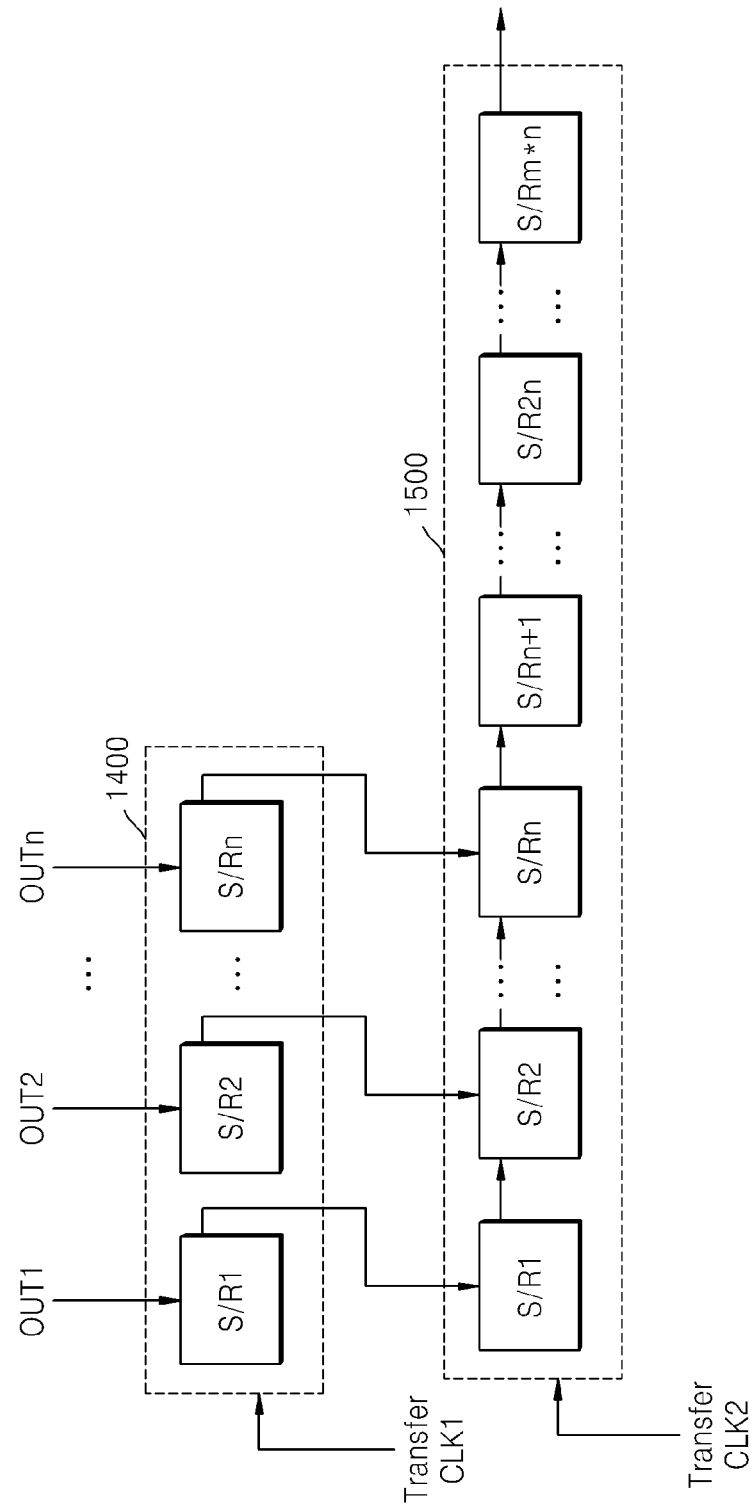

FIGS. 4A and 4B are block diagrams illustrating the first and second register units 1400 and 1500 of the semiconductor device 1000 of FIG. 1. FIGS. 4A and 4B illustrate the first and second register units 1400 and 1500 when a sense amplifier circuit 1300 is disposed to correspond to each of bit lines of the antifuse array 1100.

Referring to FIG. 4A, the sense amplifier unit 1300 includes sense amplifier circuits S/A corresponding to the n bit lines BL1 through BLn of the antifuse array 1100. Information of n antifuses 1110 disposed in one row of the antifuse array 1100 is provided in parallel to the sense amplifier unit 1300 through the n bit lines BL1 through BLn. The first register unit 1400 is a shift register unit including n registers S/R1 through S/Rn, and fuse data OUT1 through OUTn from the sense amplifier unit 1300 is provided in parallel to the n registers S/R1 through S/Rn.

The first register unit 1400 provides the fuse data OUT1 through OUTn to the second register unit 1500 sequentially, i.e., one bit at a time. The first register unit 1400 provides the fuse data OUT1 through OUTn stored therein to the second register unit 1500, bit by bit, in response to a predetermined first transfer clock signal Transfer CLK1. For example, the fuse data OUTn of the nth register S/Rn is provided to the second register unit 1500, and the (n−1)th through first fuse data OUTn−1 through OUT1 are sequentially provided to the second register unit 1500. Due to the above operation, after information of each of the n antifuses 1110 in a first row of the antifuse array 1100 is provided to the second register unit 1500, information of n antifuses 1110 in a second row of the antifuse array 1100 is provided to the second register unit 1500. Likewise, a plurality of information of other rows of the antifuse array 1100 is provided to the second register unit 1500 in a like manner.

The second register unit 1500 receives the fuse data OUT1 through OUTn in response to a predetermined second transfer clock signal Transfer CLK2 and moves the fuse data OUT1 through OUTn. The second transfer clock signal Transfer CLK2 can be a clock signal having the same period and/or the same phase as those of the first transfer clock signal Transfer CLK1. The second register unit 1500 can include a number of registers corresponding to the number of antifuses 1110 included in the antifuse array 1100. For example, if the antifuse array 1100 includes antifuses 1110 corresponding to m rows and n columns, the second register unit 1500 can include m*n registers S/R1 through S/Rm*n.

The first register S/R1 of the second register unit 1500 receives and stores fuse data OUT1 through OUTn in response to the second transfer clock signal Transfer CLK2, and transmits the fuse data OUT1 through OUTn to an adjacent register, for example, the second register S/R2. In the abovementioned sequential receiving and transmitting operation, all of the fuse data OUT1 through OUTn from all rows of the antifuse array 1100 is stored in the second register unit 1500. For example, if the antifuses 1110 of the antifuse array 1100 are sequentially selected in an order from a first row to an mth row, the second register unit 1500 sequentially stores the fuse data OUT1 through OUTn in a direction from the first row toward the mth row of the antifuse array 1100. The fuse data OUT1 through OUTn stored in the second register unit 1500 includes various pieces of information for setting an operating environment of the semiconductor device 1000.

FIG. 4B illustrates an example where fuse data is transmitted between the first register unit 1400 and the second register unit 1500, according to another embodiment of the inventive concepts. Referring to FIG. 4B, the first register unit 1400 can be a shift register unit that includes n registers S/R1 through S/Rn. The second register unit 1500 can be a shift register unit including m*n registers S/R1 through S/Rm*n. The first register unit 1400 can transmit in parallel fuse data OUT1 through OUTn of one row to at least some registers, for example, n registers, of the second register unit 1500. The transmitted fuse data OUT1 through OUTn are shifted bit by bit. When a row of fuse data OUT1 through OUTn is shifted, fuse data OUT1 through OUTn is transmitted in parallel as another row from the first register unit 1400 to the second register unit 1500.

FIGS. 4A and 4B are different from each other in that the first register unit 1400 sequentially, or serially, transmits fuse data to the second register unit 1500 bit by bit in FIG. 4A, whereas the first register unit 1400 sequentially, or serially, transmits fuse data to the second register unit 1500 in units of n bits in FIG. 4B. That is, several bits can be transmitted instead of one bit at a time. The following explanation will be made on the assumption that the first register unit 1500 is a shift register unit and the first register unit 1400 transmits fuse data to the second register unit 1500 bit by bit, for example, as shown in FIG. 4A.

Figure 5:
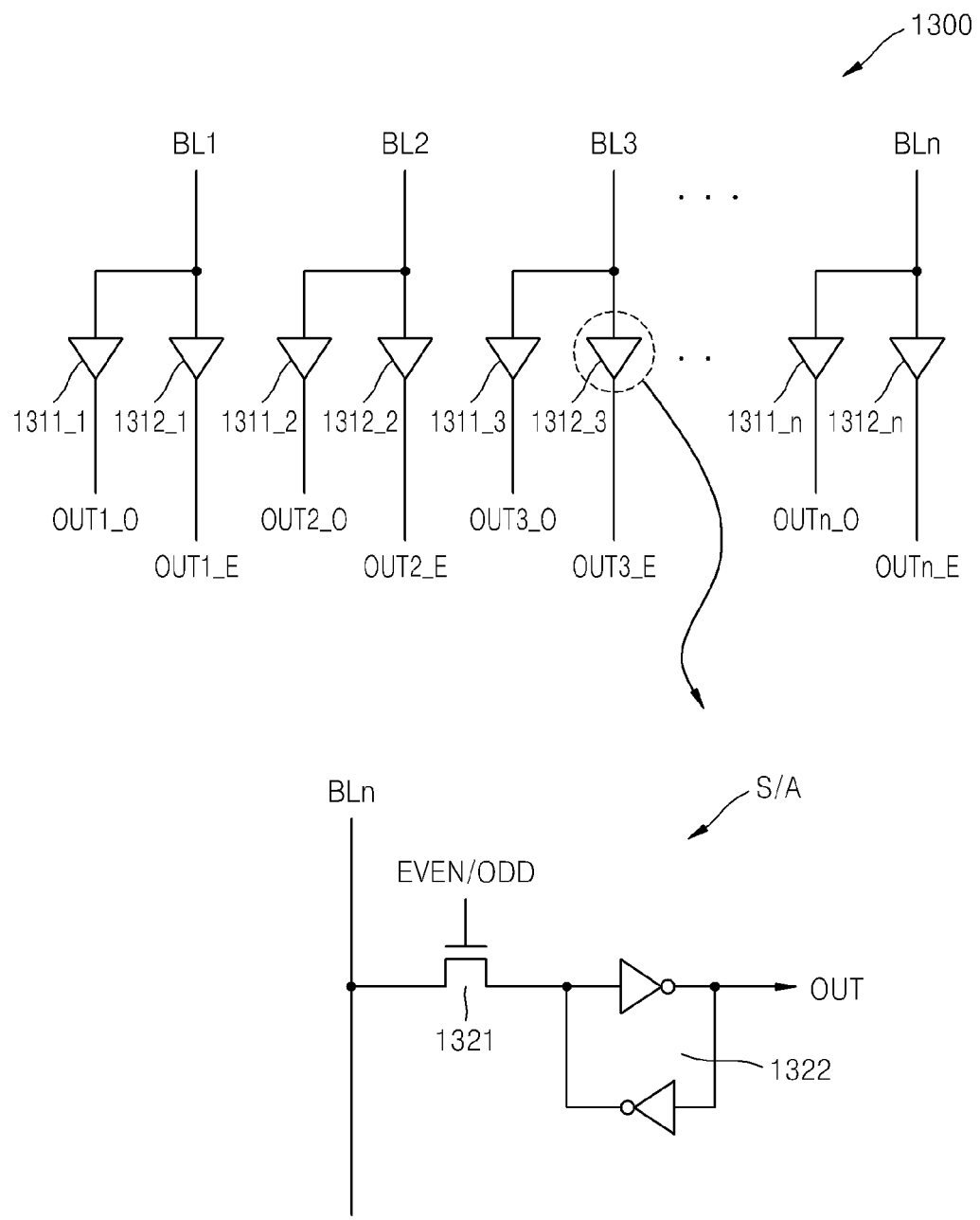
FIG. 5 is a block diagram illustrating a sense amplifier unit of the semiconductor device of FIG. 1.

FIG. 5 is a block diagram illustrating the sense amplifier unit 1300 of the semiconductor device 1000 of FIG. 1. In FIG. 5, two sense amplifier circuits are disposed to correspond to each of bit lines of the antifuse array 1100.

Referring to FIG. 5, information read from the antifuse array 1100 is transmitted through n bit lines BL1 through BLn, and the sense amplifier unit 1300 senses and amplifies the pieces of information of the n bit lines BL1 through BLn and generates fuse data. An odd sense amplifier circuit and an even sense amplifier circuit of the sense amplifier unit 1300 can be disposed to correspond to each bit line. For example, the sense amplifier unit 1300 can include n odd sense amplifier circuits 1311_1 through 1311_n (generally, 1311) and n even sense amplifier circuits 1312_1 through 1312_n (generally, 1312) disposed to correspond to the n bit lines BL1 through BLn. The odd sense amplifier circuits 1311_1 through 1311n can sense and amplify information provided from antifuses 1110 of odd rows of the antifuse array 1100, and the even sense amplifier circuits 1312_1 through 1312_n can sense and amplify information provided from antifuses 1110 of even rows of the antifuse array 1100.

If a first row of the antifuse array 1100 is selected, information of the first row is sensed and amplified by the odd sense amplifier circuits 1311_1 through 1311_n, and a result of the sensing and amplifying is provided as odd fuse data OUT1_0 through OUTn_0 to the first register unit 1400 of FIG. 1. Next, if a second row of the antifuse array 1100 is selected, a plurality of pieces of information of the second row is sensed and amplified by the even sense amplifier circuits 1312_1 through 1312_n, and a result of the sensing and amplifying is provided as even fuse data OUT1_E through OUTn_E to the first register unit 1400 of FIG. 1.

Each sense amplifier circuit can include a latch circuit 1322. In order for each sense amplifier circuit 1311, 1312 to selectively operate corresponding to a row of the antifuse array 110, a select transistor 1321 can be included in each sense amplifier circuit. The select transistor 1321 is switched in response to an even/odd signal EVEN/ODD. For example, if an even sense amplifier circuit 1312 senses and amplifies information of an even row of the antifuse array 1100, the select transistor 1321 of the predetermined sense amplifier circuit is switched in response to an even signal EVEN.

Figure 6:
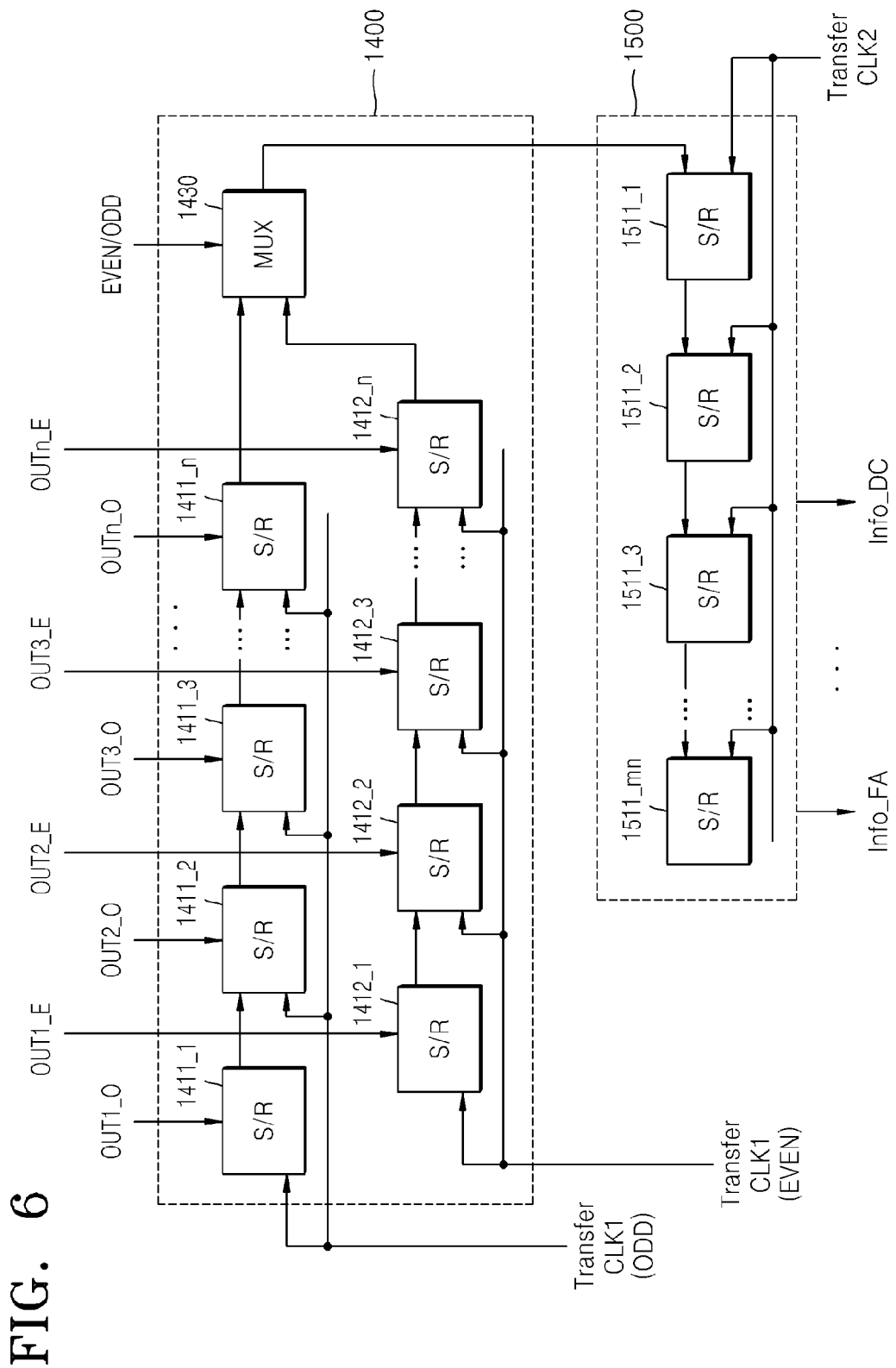
FIG. 6 is a circuit diagram illustrating first and second register units which receive fuse data from the sense amplifier unit of FIG. 5.

FIG. 6 is a circuit diagram illustrating the first and second register units 1400 and 1500 which receive fuse data from the sense amplifier unit 1300. Referring to FIG. 6, the first register unit 1400 receives odd fuse data OUT1_O through OUTn_O and even fuse data OUT1_E through OUTn_E from the sense amplifier unit 1300. The first register unit 1400 includes n odd registers 1411_1 through 1411_n which receive the odd fuse data OUT1_0 through OUTn_O, and n even registers 1412_1 through 1412_n which receive the even fuse data OUT1_E through OUTn_E. The first register unit 1400 stores and shifts fuse data in response to a first transfer clock signal Transfer CLK1. For example, an odd first transfer clock signal and an even first transfer clock signal can be provided to the first register unit 1400. Also, the first register unit 1400 can further include a multiplexer 1430 for selectively outputting fuse data from odd registers and even registers. The multiplexer 1430 can operate in response to an even/odd signal EVEN/ODD.

The second register unit 1500 can include m*n registers 1511_1 through 1511_nm, and sequentially receive fuse data from the first register unit 1400, one bit at a time. The second register unit 1500 can operate in response to a second transfer clock signal Transfer CLK2. If an odd row of the antifuse array 1100 is selected, the second register unit 1500 sequentially receives odd fuse data OUT1_O through OUTn_O from the first register unit 1400 bit by bit, and shifts the fuse data OUT1_O through OUTn_O to an adjacent register. Also, if an even row of the antifuse array 1100 is selected, the second register unit 1500 sequentially receives even fuse data OUT1_E through OUTn_E from the first register unit 1400 bit by bit, and shifts the fuse data OUT1_E through OUTn_E to an adjacent register. In the above operation, all of the fuse data of the antifuse array 1100 can be stored in the second register unit 1500. Some of the fuse data stored in the second register unit 1500 can be used as fail address information for replacing a defective cell with a redundant cell, and others can be used as trimming information Info_DC for trimming a voltage level. Also, various operating environments of the semiconductor device 1000 can be set by using other fuse data stored in the second register unit 1500.

Figure 7:
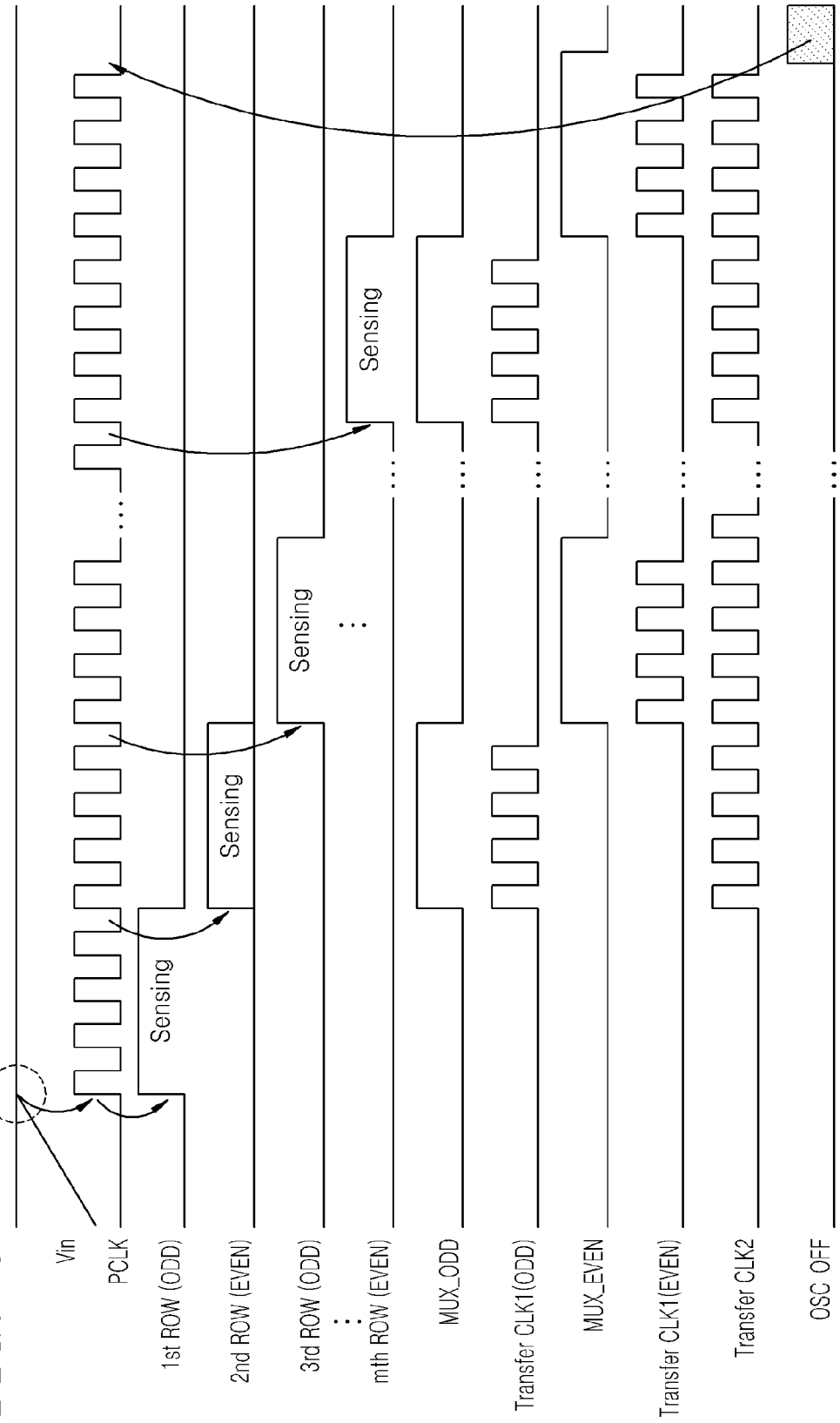
FIG. 7 is a waveform diagram illustrating characteristics of various signals for operating the semiconductor device of FIG. 1.

FIG. 7 is a waveform diagram illustrating characteristics of various signals for operating the semiconductor device 1000 of FIG. 1. The waveform diagram of FIG. 7 will be explained below with reference to the semiconductor device 1000 of FIG. 1 and the first and second register units 1400 and 1500 of FIG. 6. Here, it is assumed that four (4) columns of the antifuse array 1100 are provided. However, any number of columns can be provided.

When power is supplied to the semiconductor device 1000, an internal voltage Vint of the semiconductor device 1000 is increased, and when the internal voltage Vint reaches a predetermined level, a clock signal PCLK is generated, for example, by an oscillator (not shown) in the semiconductor device 1000. Also, various other signals can be generated in response to the clock signal PCLK. For example, a row address for selecting a row of the antifuse array 1100 can be generated by using the clock signal PCLK, and first and second transfer clock signals Transfer CLK1 and Transfer CLK2 for operating the first and second register units 1400 and 1500 can be generated by using the clock signal PCLK. In order to sequentially select rows of the antifuse array 1100 in an order from a first row to an mth row, first through mth row addresses are sequentially enabled.

First, as a first row 1st Row of the antifuse array 1100 is selected, fuse data from a first row 1st Row is stored in the odd registers 1411_1 through 1411_n of the first register unit 1400. Next, a second row 2nd Row of the antifuse array 1100 is selected, and fuse data from the second row 2nd Row are stored in the even registers 1412_1 through 1412_n of the first register unit 1400. Also, an odd signal MUX_ODD provided to the multiplexer 1430 is enabled while the second row 2nd Row is enabled, and the fuse data of the first row 1st Row stored in the odd registers 1411_1 through 1411_n are provided to the second register unit 1500. Likewise, when a third row 3rd Row of the antifuse array 1100 is selected, fuse data of the third row 3rd Row is stored in the odd registers 1411_1 through 1411_n of the first register unit 1400. Also, as an even signal MUX_EVEN provided to the multiplexer 1430 is enabled, the fuse data of the second row 2nd Row stored in the even registers 1412_1 through 1412_n is provided to the second register unit 1500.

First transfer clock signals Transfer CLK1_ODD and Transfer CLK1_EVEN control the first register unit 1400, and can have a same number of pulses as the number of columns while one row of the antifuse array 1100 is enabled. Also, second transfer clock signals Transfer CLK2 can be enabled while fuse data is transmitted from the first register unit 1400 to the second register unit 1500. When all information at the antifuse array 110 is read after power-up of the semiconductor device 1000, the oscillator can be powered down or otherwise deactivated and the clock signal PCLK can be disabled.

Figure 8:
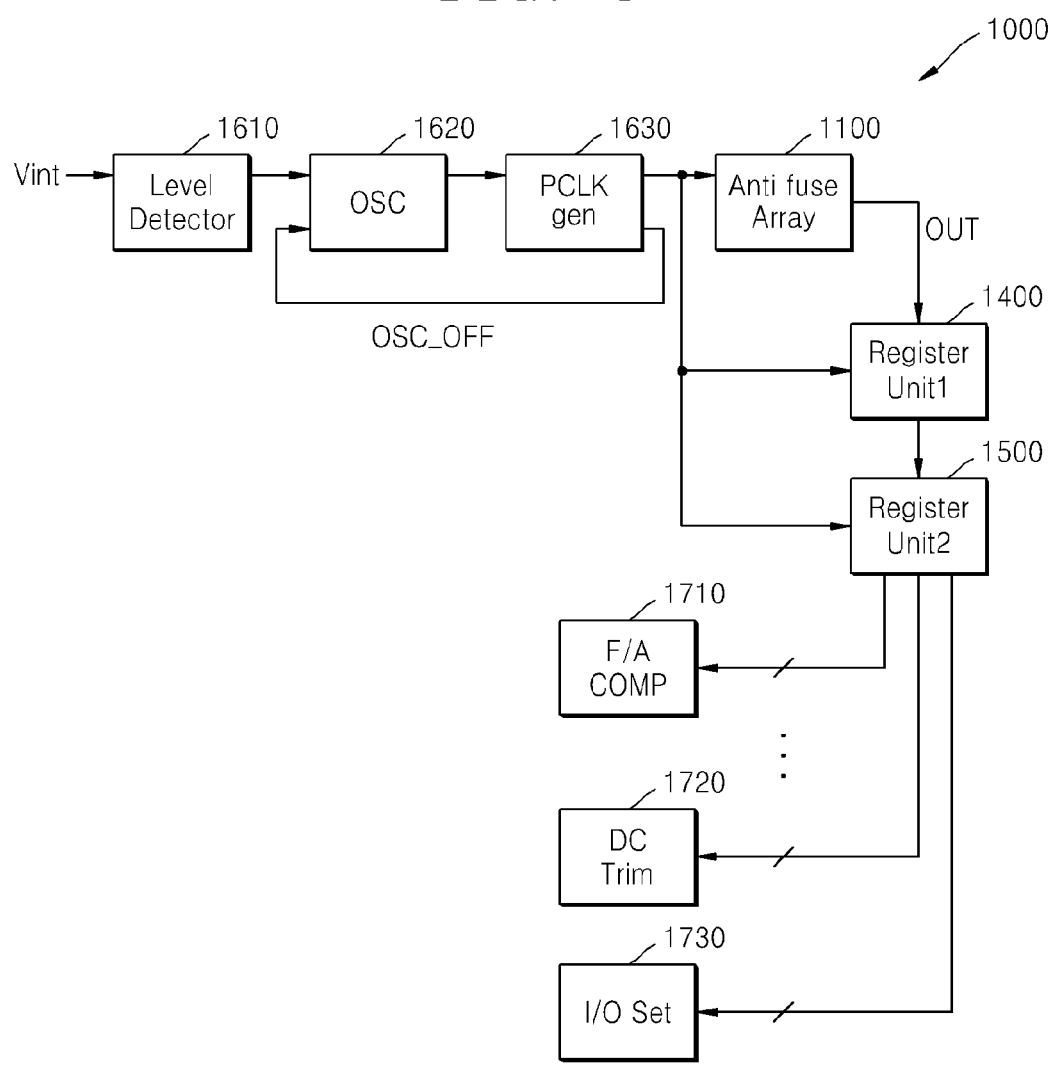
FIG. 8 is a block diagram illustrating an overall operation of the semiconductor device related to setting an operating environment, according to another embodiment of the inventive concepts.

FIG. 8 is a block diagram illustrating an overall operation of the semiconductor device 1000 for setting an operating environment. As power is supplied to the semiconductor device 1000, a level detecting unit 1610, also referred to as a level detector, detects a level of an internal voltage Vint and generates a result. An oscillator (OSC) 1620 generates an oscillation signal in response to the result of the detection. The oscillation signal is provided to a clock signal generating unit (PCLK gen) 1630, which uses the oscillation signal to generate various clock signals. For example, the clock signal generating unit 1630 can generate the clock signal PCLK shown in FIG. 7 by using the oscillation signal, and also generates a word line signal for the antifuse array 1100 based on the clock signal PCLK. Also, the clock signal generating unit 1630 can generate transfer clock signals for the first and second register units 1400 and 1500 based on the clock signal PCLK. Also, the clock signal generating unit 1630 can generate an off-control signal OSC_OFF for turning off the oscillator 1620 when fuse data is completely transmitted.

Fuse data OUT read from the antifuse array 1100 is provided to the second register unit 1500 through the first register unit 1400 and stored in the second register unit 1500. The fuse data OUT stored in the second register unit 1500 is used as information for setting various operating environments. For example, first information including fuse data of the second register unit 1500 is provided to an address comparator (F/A Comp) 1710.

The first information includes address information of a defective cell of a memory cell array (not shown) included in the semiconductor device 1000. The address comparator 1710 compares a currently received address for a read or write operation with the first information, and replaces the defective cell with a redundant cell according to a result of the comparison.

Also, second information including other fuse data of the second register unit 1500 is provided to a voltage adjusting unit (DC trim) 1720. The voltage adjusting unit 1720 generates a voltage signal having a level that is adjusted by using the second information.

Also, third information including other fuse data of the second register unit 1500 can be provided to an input/output setting unit (I/O Set) 1730. The input/output setting unit 1730 sets an environment related to data input/output, for example, the number of bits of data which are simultaneously input and output, of the semiconductor device 1000 by using the third information. In addition to the first, second, and third information, other operating environments of the semiconductor device 1000 can be set by using various pieces of information stored in the second register unit 1500.

Figure 9:
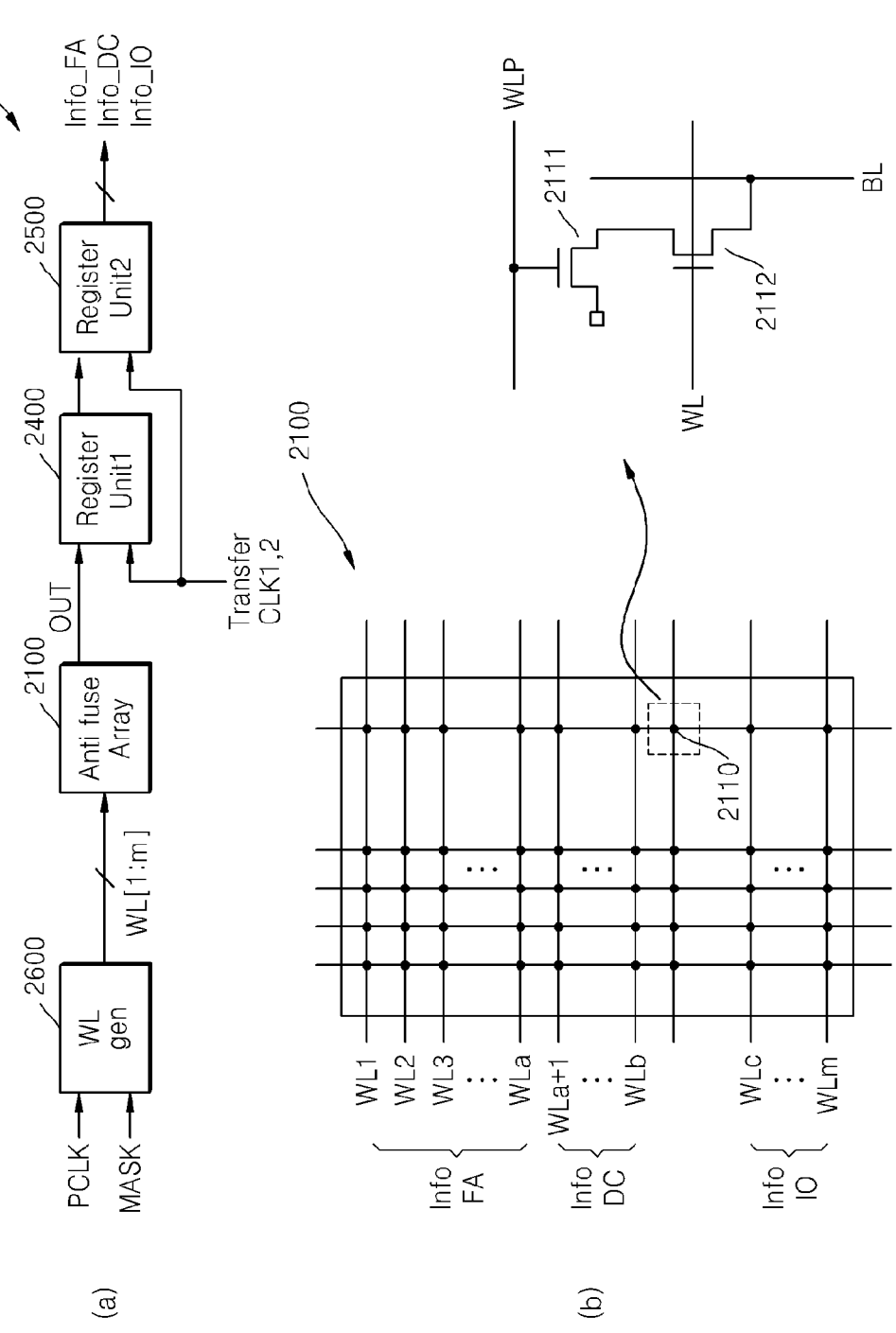
FIGS. 9A and 9B are diagrams illustrating a semiconductor device, according to another embodiment of the inventive concepts.

FIGS. 9A and 9B are diagrams illustrating a semiconductor device 2000 according to another embodiment of the inventive concepts. The semiconductor device 2000 of FIG. 9 masks one or more rows during a read operation of an antifuse array. A detailed explanation of the components and configurations of the semiconductor device 200 that are the same or similar as or to those of the semiconductor device 1000 is not provided.

Referring to FIG. 9A, the semiconductor device 2000 includes an antifuse array 2100, a first register unit 2400, and a second register unit 2500. The antifuse array 2100 can include a sense amplifier unit (not shown) for sensing and amplifying information. Also, the semiconductor device 2000 can include a word line signal generating unit (WL gen) 2600 that generates a word line signal WL[1:m] by using a clock signal PCLK and a masking signal MASK, and provides the word line signal WL[1:m] to the antifuse array 2100.

Various pieces of information related to an operation of the semiconductor device 2000 are stored in the antifuse array 2100. Referring to FIG. 9B, the antifuse array 2100 can include a plurality of antifuses 2110, and each of the antifuses 2110 can include a fuse transistor 2111 and a select transistor 2112. Address information of a defective cell can be stored in some rows WL1 through WLa of the antifuse array 2100, information for trimming a voltage signal can be stored in other rows WLa+1 through WLb, and information for setting various operating environments can be stored in other rows WLc through WLm.

Since the antifuse array 2100 of the semiconductor device 2000 has an array arrangement including a plurality of rows and a plurality of columns, the antifuse array 2100 can be accessed at random. Accordingly, some of the word line signals WL[1:m] can be disabled by providing a masking signal MASK to the word line signal generating unit 2600. Also, a plurality of pieces of information of the antifuse array 2100 corresponding to the disabled word line signals may not be read. For example, when a memory system employing the semiconductor device 2000 is driven, if information for trimming a voltage signal in the semiconductor device 2000 from among a plurality of pieces of information stored in the antifuse array 2100 is not used, some word line signals WL[a+1:b] provided to the antifuse array 2100 can be disabled by enabling the masking signal MASK while some rows WLa+1 through WLb of the antifuse array 2100 are selected.

Figure 10:
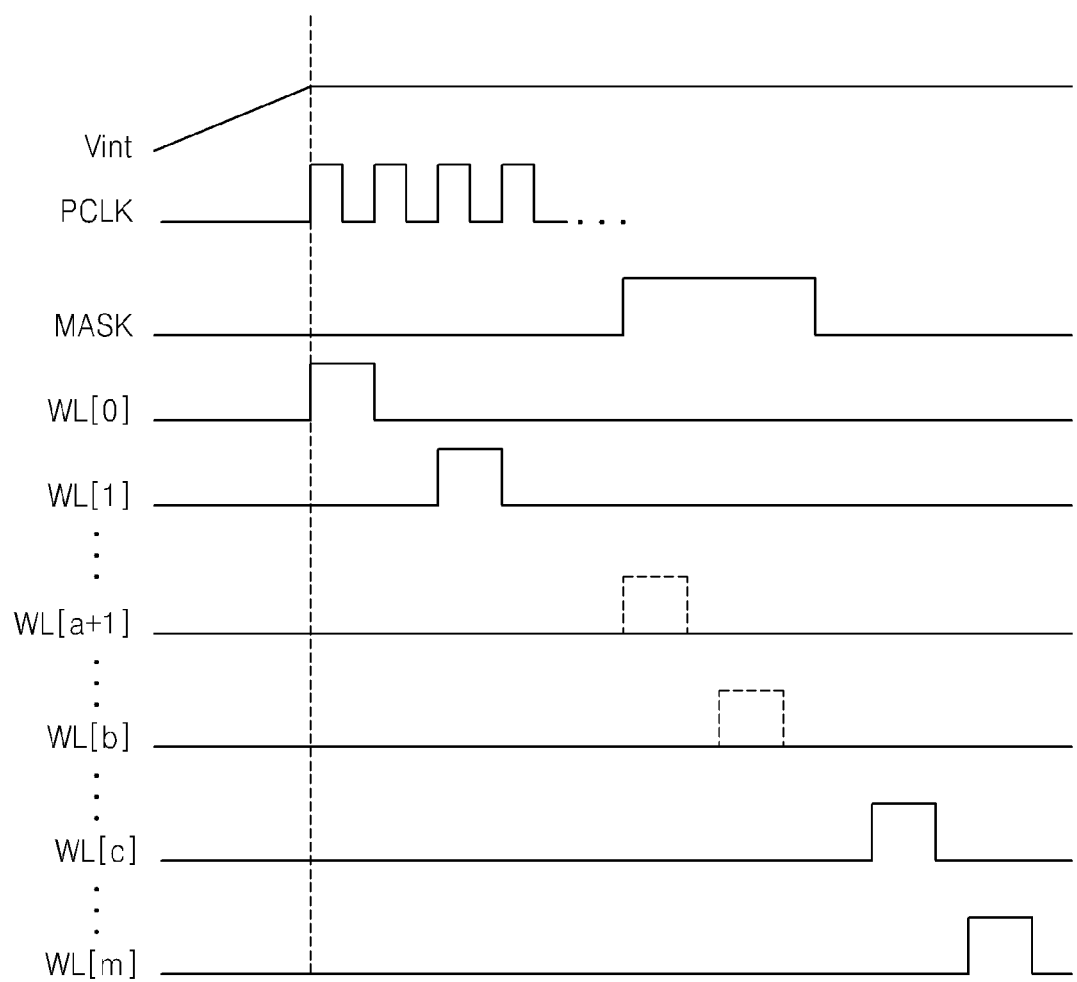
FIG. 10 is a timing diagram illustrating an operation of the semiconductor device of FIG. 9.

FIG. 10 is a timing diagram illustrating an operation of the semiconductor device 2000 of FIG. 9. The semiconductor device 2000 includes a clock generating circuit (not shown) for generating various clock signals. Referring to FIG. 10, when an internal voltage Vint is increased to reach a predetermined level, a clock signal PCLK is generated. A word line signal WL[1:m] provided to the antifuse array 2100 is enabled based on the clock signal PCLK. Also, a masking signal MASK which is enabled during a predetermined period of time can be generated by using the clock signal PCLK, and the word line signal WL[1:m] is disabled while the masking signal MASK is enabled. For example, a+1 through b word line signals WL[a+1:b] are disabled while the masking signal MASK is enabled. Accordingly, a+1 through b rows of the antifuse array 2100 are not accessed.

Figure 11:
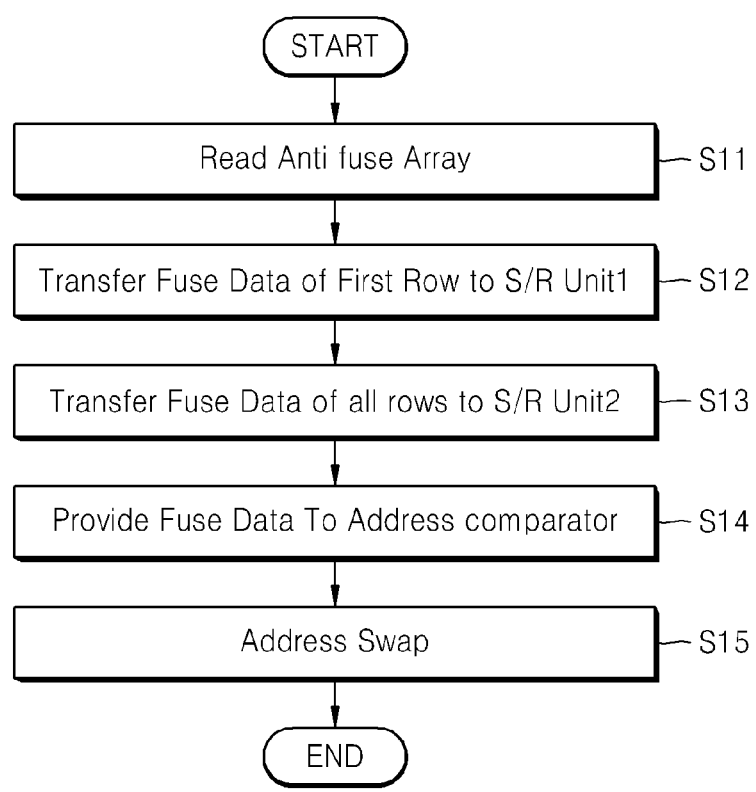
FIG. 11 is a flowchart illustrating a method of operating a semiconductor device, according to an embodiment of the inventive concepts.

FIG. 11 is a flowchart illustrating a method of operating a semiconductor device, according to an embodiment of the inventive concepts. The semiconductor device includes an antifuse array, which has an array arrangement in which antifuses are disposed at intersections between a plurality of rows and a plurality of columns.

Referring to FIG. 11, in operation S11, when power is supplied to the semiconductor device, a read operation of the antifuse array is performed. The antifuse array can be read in units of rows. For example, in operation S12, fuse data of a first row of the antifuse array are transmitted in parallel to a first register unit through a sense amplifier circuit. In operation S13, the fuse data stored in the first register unit is transmitted in series to a second register unit, and the above operation is repeatedly performed until all of the fuse data stored in the antifuse array is stored in the second register unit. The first register unit can transmit in series the fuse data to the second register unit bit by bit, or can transmit in series the fuse data to the second register unit n bits by n bits.

The fuse data stored in the second register unit is used to set an operating environment of the semiconductor device. In operation S14, for example, some of the fuse data can be defective address information for replacing a defective cell generated in a memory cell array with a redundant cell, and the defective address information is provided to an address comparator. In operation S15, the address comparator compares the defective address information with a currently received address, and replaces a defective address with a redundant address according to a result of the comparison. Although not shown in FIG. 11, other fuse data stored in the second register unit can be used to set other operating environments of the semiconductor device.

Figure 12:
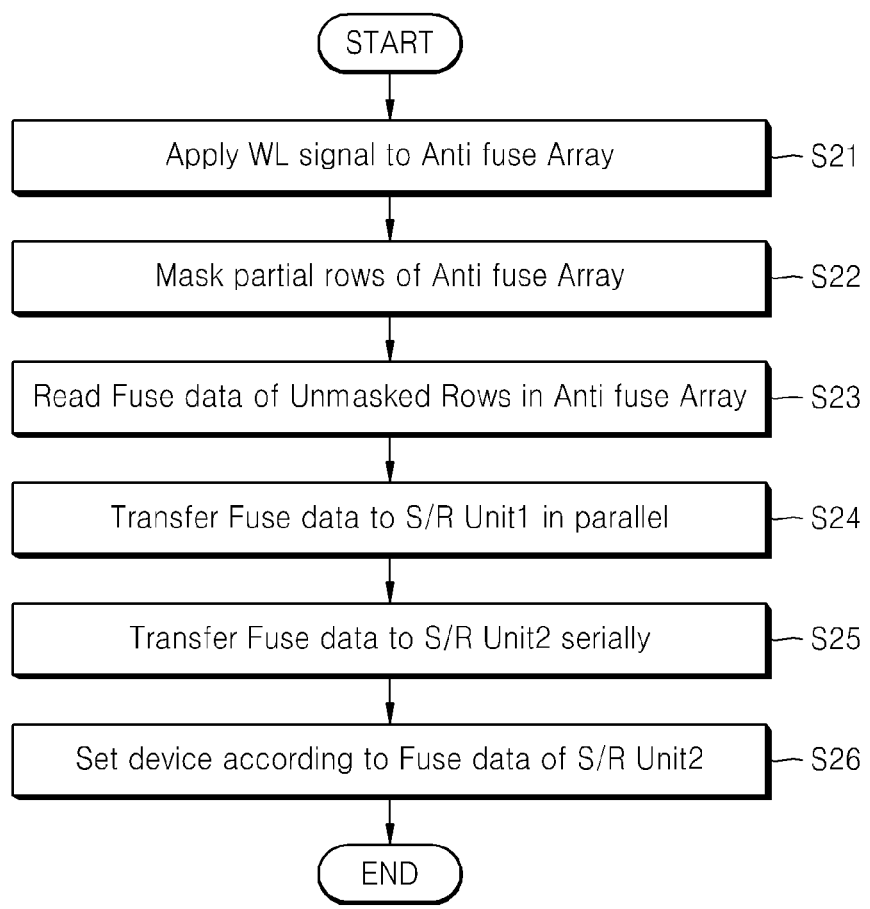
FIG. 12 is a flowchart illustrating a method of operating a semiconductor device, according to another embodiment of the inventive concepts.

FIG. 12 is a flowchart illustrating a method of operating a semiconductor device, according to another embodiment of the inventive concepts. Referring to FIG. 12, in operation S21, a word line signal is provided to an antifuse array in order to read information of the antifuse array. For example, if the antifuse array includes m rows, then first through mth word line signals can be sequentially provided to the antifuse array.

One or more rows of the antifuse array may not be used to set an operating environment of the semiconductor device. For example, even though a plurality of pieces of information for setting an operating environment of the semiconductor device are stored in all rows of the antifuse array, some of the information of the antifuse array are not used according to operation characteristics of a system employing the semiconductor device. Accordingly, in operation S22, those rows of the antifuse array storing not-used information are masked. In operation S23, fuse data in remaining unmasked rows of the antifuse array are read.

In operation S24, the fuse data selectively read from the antifuse array can be provided in parallel to a first register unit for storage at the first register unit. In operation S25, also, the fuse data stored in the first register unit is provided serially to a second register unit (S/R Unit 1). In operation S26, an operating environment of the semiconductor device is set by using the fuse data stored in the second register unit (S/R Unit 2).

The above explanation has been made on the assumption that an antifuse array is a fuse array. However, the inventive concepts are not limited to antifuses. For example, general electrical fuses or laser fuses can be used.

Figure 13:
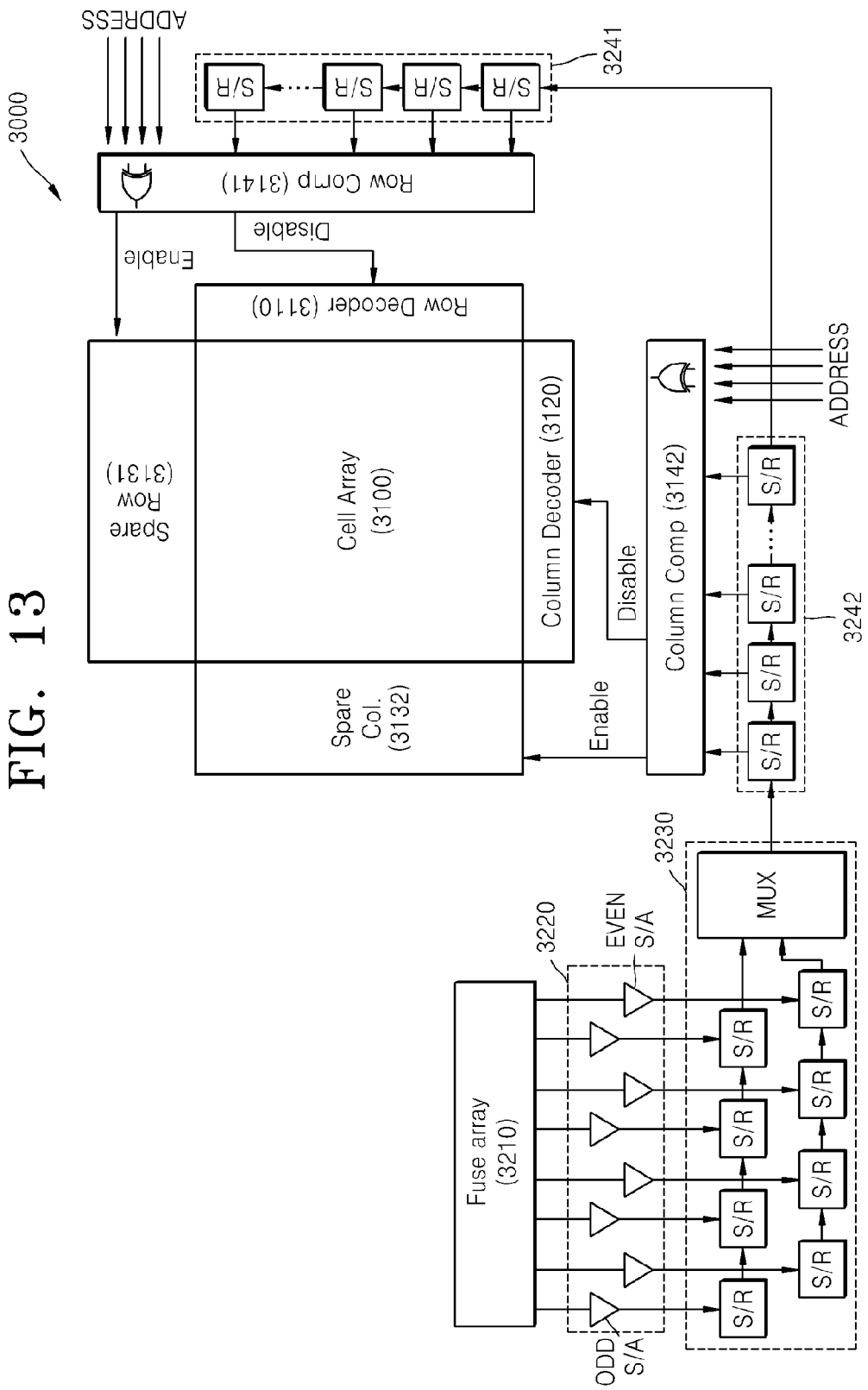
FIG. 13 is a block diagram illustrating a detailed structure of a semiconductor device, according to an embodiment of the inventive concepts.

FIG. 13 is a block diagram illustrating a detailed structure of a semiconductor device 3000 according to an embodiment of the inventive concepts. Referring to FIG. 13, the semiconductor device 3000 includes a cell array 3100 for storing data, row and column decoders 3110 and 3120 for driving a word line and a bit line of the cell array 3100, spare row and column decoders 3131 and 3132 for driving a redundant cell, and row and column address comparing units 3141 and 3142 for comparing address information of a defective cell with an external address. Also, the semiconductor device 3000 can include a fuse array 3210 including a plurality of rows and a plurality of columns, a sense amplifier unit 3220 for sensing and amplifying information of the fuse array 3210, and first and second register units 3230, 3241, and 3242 for receiving and storing fuse data. Various blocks related to fuses illustrated in FIG. 13, for example, the fuse array 3210, the sense amplifier unit 3220, and the first and second register units 3230, 3241, and 3242 can be any one of those in the above embodiments using antifuses, laser fuses, and the like.

The first register unit 3230 is connected to an output of the sense amplifier unit 3220, and the number of registers included in the first register unit 3230 is related to the number of the columns of the fuse array 3210. For example, the fuse array 3210 can include n columns, and an odd sense amplifier circuit and an even sense amplifier circuit can disposed to correspond to one column. In this case, the first register unit 3230 can include 2*n registers. Also, the first register unit 3230 can further include a multiplexer for selecting fuse data from n odd registers and n even registers. Also, the second register unit 3241 and 3242 can include one or more register blocks, for example, a first register block 3241 and a second register block 3242 are included in the second register unit 3241 and 3242.

The second register unit 3241 and 3242 sequentially receives and stores fuse data from the register unit 3230 bit by bit. Also, the second register unit 3241 and 3242 can be adjacent various circuit blocks requiring fuse data. For example, a first register block of the second register unit 3241 storing row address information of a defective cell can be positioned to be adjacent the row address comparing unit 3141. Also, a second register block of the second register unit 3242 storing column address information of a defective cell can be positioned to be adjacent the column address comparing unit 3142.

The row address comparing unit 3141 compares a row address provided from the outside with row address information of a defective cell, and drives the row decoder 3110 or the spare row decoder 3131 according to a result of the comparison. Likewise, the column address comparing unit 3142 compares an externally provided column address with column address information of a defective cell, and drives the column decoder 3120 or the spare column decoder 3132 according to a result of the comparison. Each of the row and column address comparing units 3141 and 3142 includes a plurality of logic devices for comparing bits of an address from the outside with bits of column address information of a defective cell. For example, the logic devices can include an exclusive OR gate.

Figure 14:
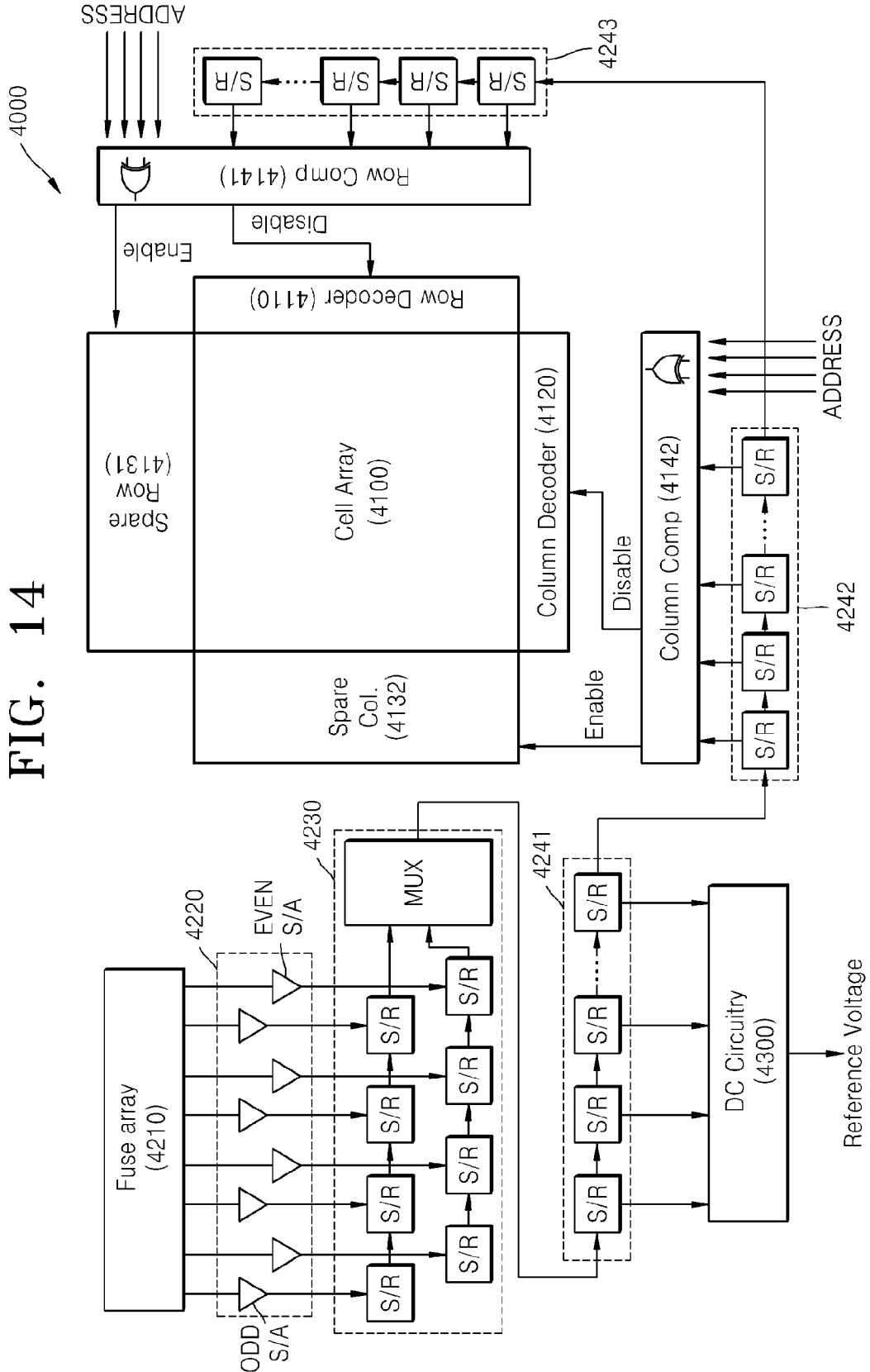
FIG. 14 is a block diagram illustrating a detailed structure of a semiconductor device, according to another embodiment of the inventive concepts.

FIG. 14 is a block diagram illustrating a detailed structure of a semiconductor device 4000 according to another embodiment of the inventive concepts. Referring to FIG. 14, the semiconductor device 4000 includes a cell array 4100 for storing data, and various circuit blocks, for example, row and column decoders 4110 and 4120, spare row and column decoders 4131 and 4132, and row and column address comparing units 4141 and 4142, for driving the cell array 4100. The semiconductor device 4000 can include a fuse array 4210, a sense amplifier unit 4220, and first and second register units 4230, 4241, 4242, and 4243, and also include a voltage generating circuit 4300 for generating a voltage signal (for example, a reference voltage) used in the semiconductor device 4000. Also, a first through third register blocks 4241, 4242 and 4243 can be included in the second register unit 4241, 4242, and 4243.

Information stored in the fuse array 4210 is provided through the sense amplifier unit 4220 and the first register unit 4230 to a second register unit comprising first through third register blocks 4241, 4242, and 4243. Fuse data stored in the first register unit 4230 are transmitted due to a data shifting operation of registers included in the register blocks 4241, 4242, and 4243. For example, row address information of a fail cell can be transmitted through the first register block 4241 and the second register block 4242 to the third register block 4243, and column address information of the fail cell can be transmitted through the first register block 4241 to the second register block 4242.

When the fuse data is stored in the register blocks 4241, 4242, and 4243 in the above operation, the semiconductor device 4000 sets an operating environment by using the fuse data stored in the register blocks 4241, 4242, and 4243. For example, the fuse data stored in the first register block 4241 are provided to the voltage generating circuit 4300, and the voltage generating circuit 4300 generates a voltage signal of which a level is trimmed by using the fuse data. Also, the fuse data stored in the second register block 4242 are provided to the column address comparing unit 4142, and the fuse data stored in the third register block 4243 are provided to the row address comparing unit 4141.

Figure 15:
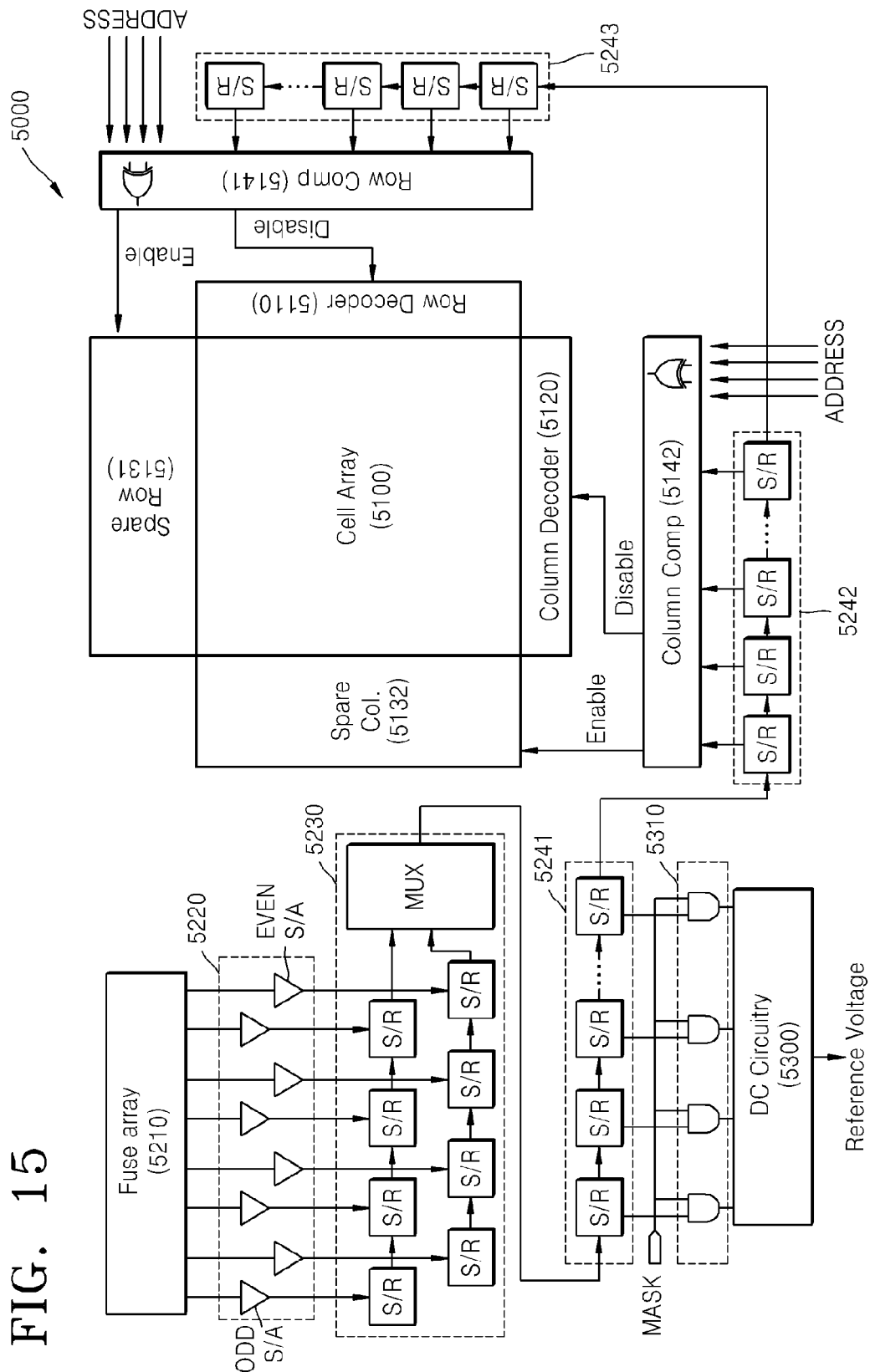
FIG. 15 is a block diagram illustrating a detailed structure of a semiconductor device, according to another embodiment of the inventive concepts.

FIG. 15 is a block diagram illustrating a detailed structure of a semiconductor device 5000 according to another embodiment of the inventive concepts. Referring to FIG. 15, the semiconductor device 5000 includes a cell array 5100 for storing data, row and column decoders 5110 and 5120, spare row and column decoders 5131 and 5132, and row and column address comparing units 5141 and 5142. The semiconductor device 5000 can include a fuse array 5210, a sense amplifier unit 5220, a first unit 5230 and a second register unit comprising register blocks 5241, 5242, and 5243, and also include a voltage generating unit 5300 for generating a voltage signal (for example, a reference voltage) used in the semiconductor device 5000. Also, the semiconductor device 5000 can further include at least one masking circuit 5310.

Information stored in the fuse array 5210 is transmitted through the sense amplifier unit 5220 and the first register unit 5230 to the second register unit 5241, 5242, and 5243. For example, row address information of a fail cell is transmitted through the first register block 5241 and the second register block 5242 to the third register block 5243. Fuse data stored in the first register block 5241 are provided to the voltage generating circuit 5300, and the voltage generating circuit 5300 generates a voltage signal of which a level is trimmed by using the fuse data.

Although fuse data related to voltage trimming is transmitted to the voltage generating circuit 5300, since a plurality of information stored in the fuse array 5210 is sequentially transmitted through registers of the second register unit 5241, 5242, and 5243 which are connected in series, fuse data having other pieces of information can be temporarily stored in the first register block 5241. In this case, since the voltage generating circuit 5300 generates a voltage signal through trimming by using the fuse data temporarily stored in the first register block 5241, the voltage generating unit 5300 unnecessarily continuously trims a voltage signal while the fuse data is moved. In order to prevent this problem, the masking circuit 5310 prevents the fuse data from being provided to a circuit block for a predetermined period of time.

Although the masking circuit 5310 is disposed to correspond to the first register block 5241 (or the voltage generating circuit 5300) in FIG. 15, the present embodiment is not limited thereto. The masking circuit 5310 can be disposed to correspond to various circuit blocks which receive fuse data. For example, the masking circuit 5310 can be disposed to correspond to register blocks that transmit various types of information in fuse data transmission paths. The masking circuit 5310 receives a masking signal MASK and controls fuse data to be transmitted in response to the masking signal MASK. The masking circuit 5310 can include a plurality of logic devices. For example, referring to FIG. 15, the masking circuit 5310 can include a NAND gate of which a first input terminal is connected to the masking signal MASK.

An operation of the masking circuit 5310 disposed to correspond to the first register block 5241 is explained herein. While other pieces of information of the fuse array 5210 are transmitted, the masking signal MASK is maintained in a row state. Accordingly, fuse data stored in the first register block 5241 is prevented from being provided to the voltage generating circuit 5300. Next, when information for trimming a voltage stored in the fuse array 5210 is read, corresponding fuse data is transmitted through the sense amplifier unit 5220 and the first register unit 5230 to the first register block of the second register unit 5241. The masking signal MASK is changed to a high level while the fuse data for trimming a voltage is transmitted to the first register block 5241, and thus the fuse data is provided to the voltage generating circuit 5300.

Figure 16:
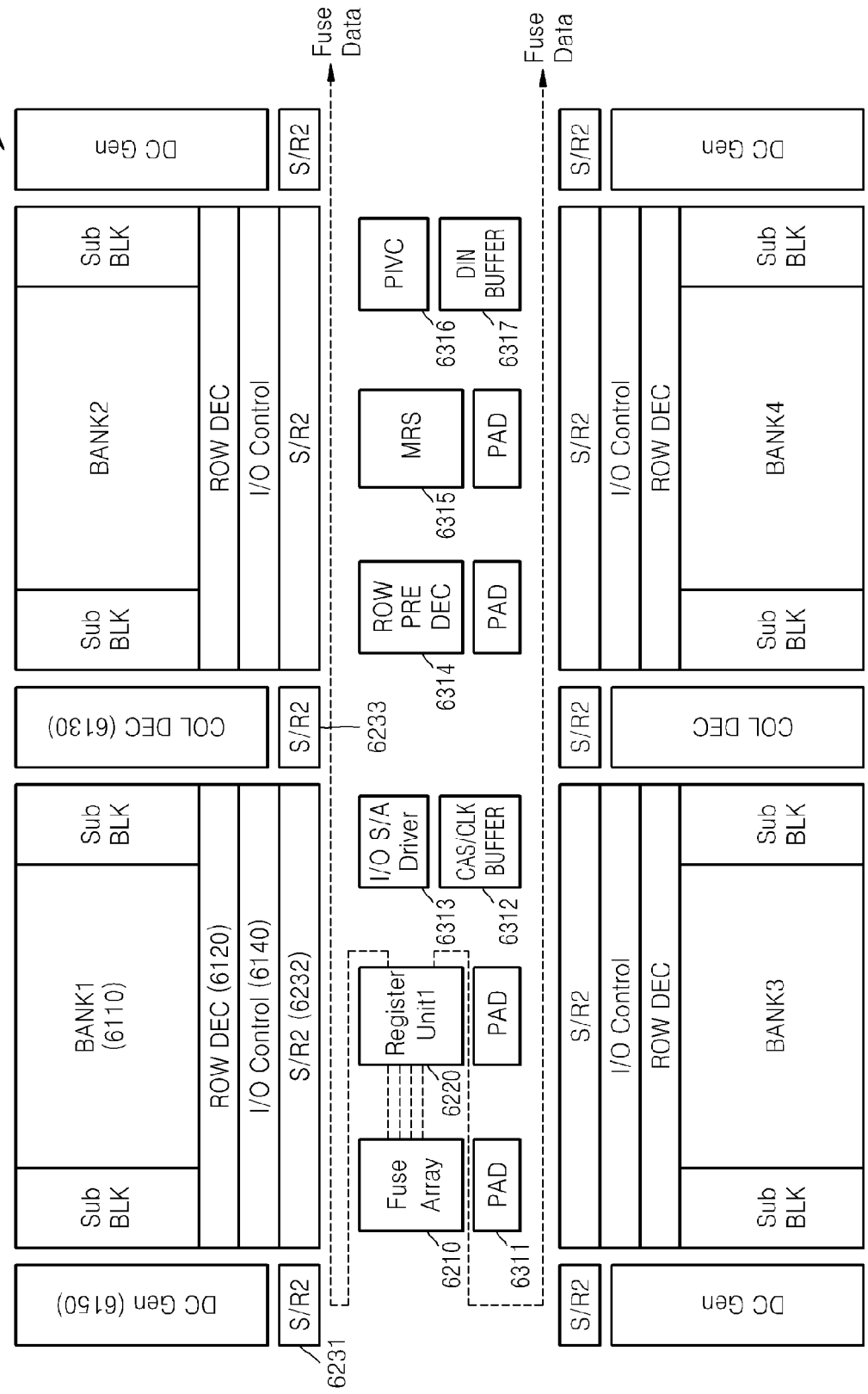
FIG. 16 is a block diagram illustrating an arrangement of components in a semiconductor device, according to another embodiment of the inventive concepts.

FIG. 16 is a block diagram illustrating an arrangement of components in a semiconductor device 6000, in accordance with an embodiment. Referring to FIG. 16, the semiconductor device 6000 includes a cell array 6110. The cell array 6110 includes a plurality of memory banks, for example, first through fourth memory banks BANK1 through BANK4. Each of the first through fourth memory banks BANK1 through BANK4 includes an extra block for replacing a defective cell. Also, the semiconductor device 6000 includes various circuit blocks for driving the first through fourth memory banks BANK1 through BANK4. For example, the semiconductor device 6000 includes row and column decoders 6120 and 6130, an input/output control unit 6140, and a voltage generating circuit 6150 for generating a voltage signal provided to the cell array 6110. The semiconductor device 6000 can include other peripheral circuits for driving the first through fourth memory banks BANK1 through BANK4, for example, a pad layer 6311, a command/clock signal buffer 6312, an input/output driving unit 6313, a row pre-decoder 6314, a mode register set (MRS) 6315, an internal power generating unit 6316 for generating a voltage signal used in the peripheral circuits, and an input buffer 6317. Also, the semiconductor device 6000 includes a fuse array 6210, a first register unit 6220, and a second register unit comprising register blocks 6231, 6232, and 6233.

The semiconductor device 6000 includes a cell region in which the cell array 6110 is disposed, and a peripheral region, referred to as a peri region, in which the peripheral circuits for driving the cell array 6110 are disposed.

Fuses can be disposed in the cell region or adjacent to the cell region, and information for setting an operating environment of the semiconductor device 6000 can be stored by programming the fuses. In this case, although an area of the cell region is reduced as the cell array 6110 is more highly integrated, since it is difficult to reduce a size of each of the fuses, there is a limitation in reducing an area of the cell region due to the fuses. However, according to the above embodiments of the inventive concepts, the fuse array 6210 and the first register unit 6220 can be disposed in the peri region of the semiconductor device 6000, and fuse data stored in the register unit 6220 are transmitted to the second register units 6231, 6232, and 6233 adjacent the cell region.

The fuse array 6210 can include electrical fuses, antifuses, or laser fuses. If the fuse array 6210 includes laser fuses, since laser for programming is radiated to the cell array 6110 and characteristics of the cell array 6110 are deteriorated, the laser fuses are arranged in consideration of the deterioration.

Although fuse data transmission paths include a first path adjacent to the first and second banks BANK1 and BANK2 and a second path adjacent to the third and fourth banks BANK3 and BANK 4 in FIG. 16, the present embodiment is not limited thereto and various modifications can be made.

FIGS. 17A through 17D are block diagrams illustrating a memory system including a memory controller and a memory device, in accordance with an embodiment. In FIGS. 17A through 17D, the memory device is used as any of the semiconductor devices according to the above embodiments of the inventive concepts, and the memory device is a dynamic random access memory (DRAM) or a flash memory device.

Figure 17:
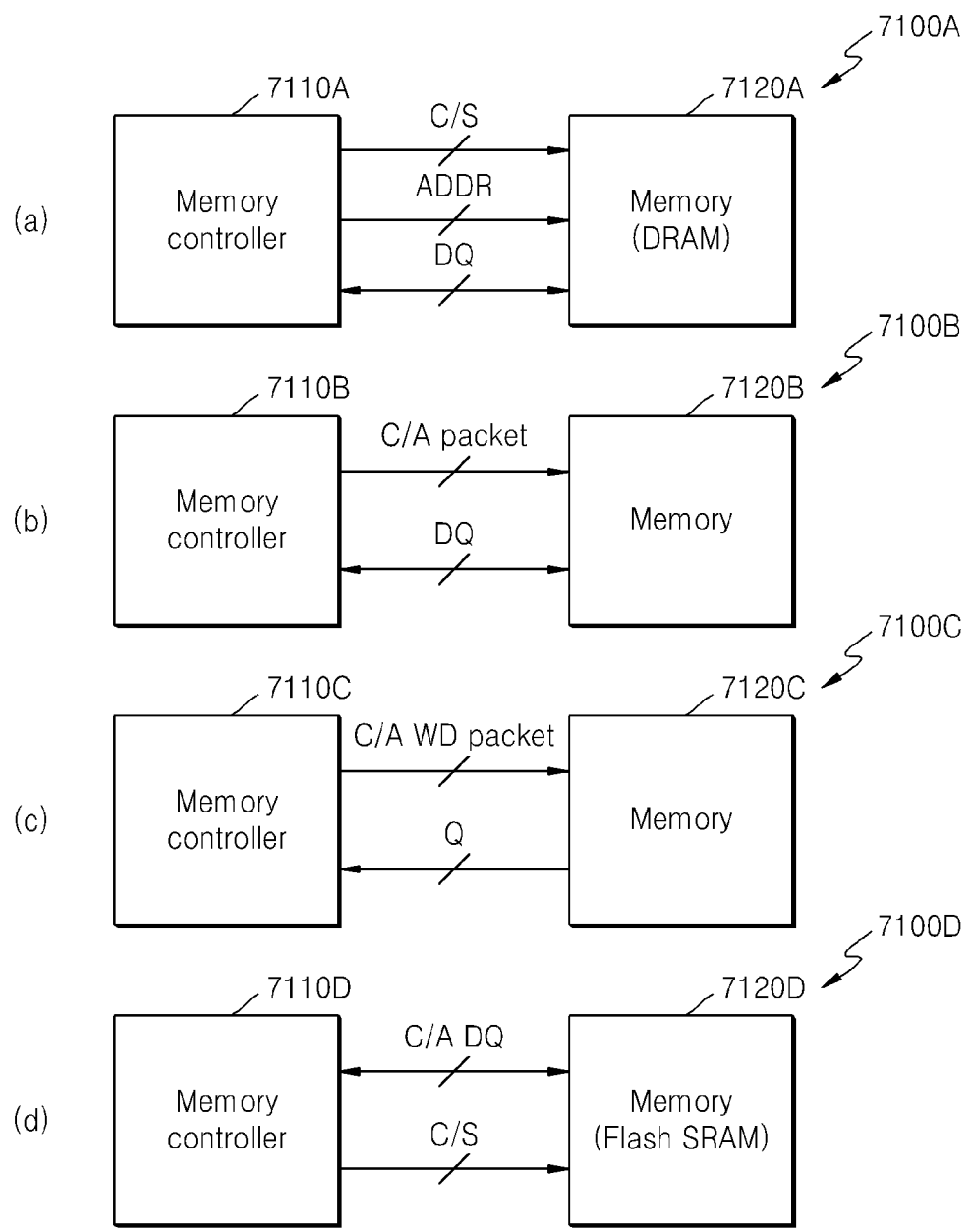
FIGS. 17A through 17D are block diagrams illustrating a memory system including a memory controller and a memory device, according to another embodiment of the inventive concepts.

Referring to a memory system 7100A of FIG. 17A, a bus protocol is shown between a memory controller 7110A and a memory device (for example, a DRAM) 7120A, and a control signal C/S such as /CS, CKE, /RAS, /CAS, or /WE and an address signal ADDR are provided from the memory controller 7110A to the memory device 7120A. Data DQ is transmitted in both directions. The memory device 7120A includes an antifuse array (not shown) having an array arrangement. When power is supplied to the memory device 7120A, an operating environment is set using information stored in the antifuse array as described above.

Referring to a memory system 7100B of FIG. 17B, a packetized control and address signal C/A Packet is provided from a memory controller 7110B to a memory device 7120B, and data DQ is transmitted in both directions. Referring to a memory system 7100C of FIG. 17C, a packetized control and address signal and write data C/A/WD Packet is provided from a memory controller 7110C to a memory device 7120C, and a data output Q is transmitted from the memory device 7120C to the memory controller 7110C in one direction. Referring to a memory system 7100D of FIG. 17D, a control signal C/S is provided from a memory controller 7110D to a memory device 7120D, for example, a flash static random access memory (SRAM), and a command, an address, and data C/A/DQ are transmitted in both directions. Each of the memory devices 7120B, 7120C, and 7120D of FIGS. 17B through 17D includes a fuse array. When power is supplied to a memory device, an operating environment is set in a manner similar to that described above.

Figure 18:
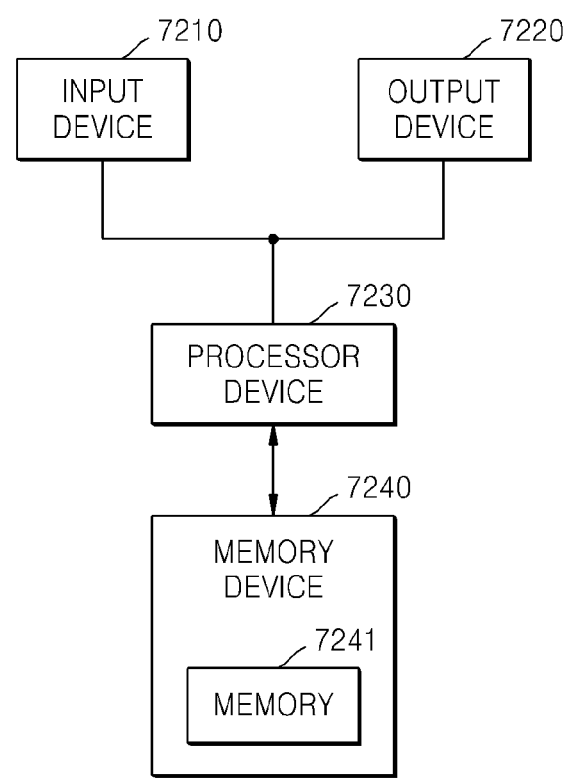
FIG. 18 is a block diagram illustrating an electronic system including a semiconductor device, according to another embodiment of the inventive concepts.

FIG. 18 is a block diagram illustrating an electronic system 7200 including a semiconductor device, in accordance with an embodiment. Referring to FIG. 18, the electronic system 7200 includes an input device 7210, an output device 7220, a processor device 7230, and a semiconductor memory device 7240. The semiconductor memory device 7240 can include a memory 7241, and also include a memory controller (not shown) for driving the memory 7241. The processor device 7230 controls the input device 7210, the output device 7220, and the semiconductor memory device 7240 through corresponding interfaces.

The memory 7241 can be any one of the semiconductor devices referred to the abovementioned embodiments. During operation of the electronic system 7200, power is supplied to the memory 7241 under the control of the processor device 7230, and information stored in a fuse array inside the memory 7241 is read to set an operating environment of the semiconductor memory device 7240.

Figure 19:
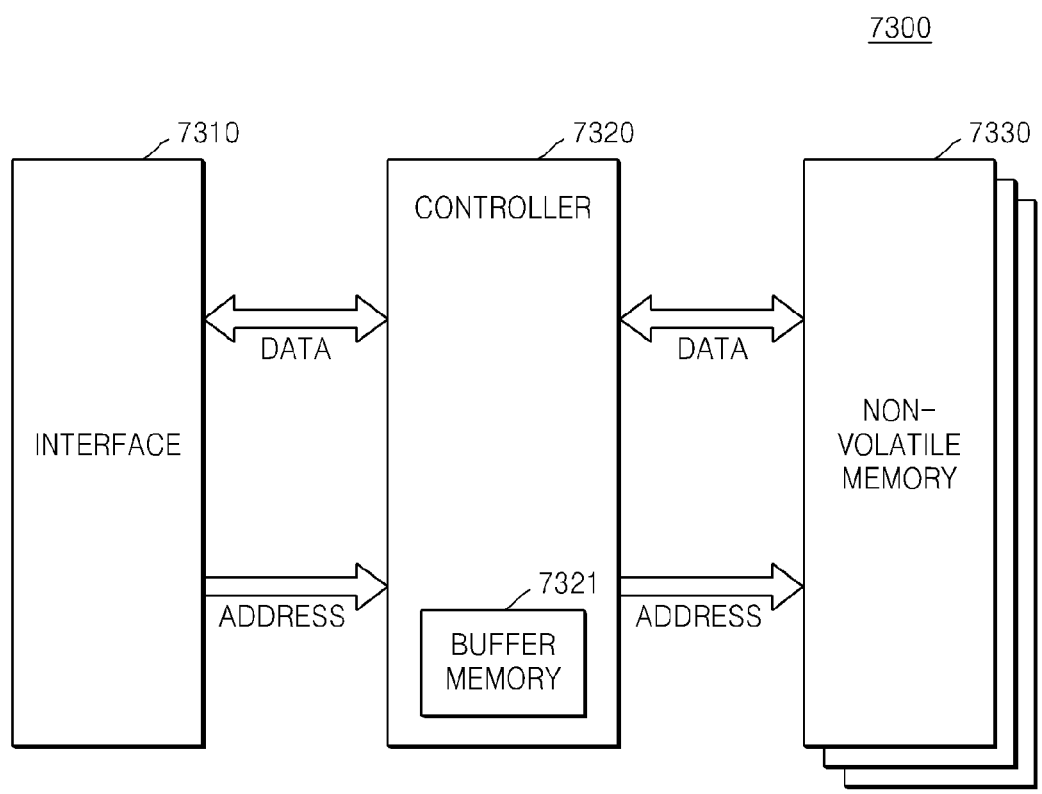
FIG. 19 is a block diagram illustrating an application of a memory card having a semiconductor device, according to another embodiment of the inventive concepts.

FIG. 19 is a block diagram illustrating a memory card 7300 using a semiconductor device, in accordance with an embodiment. Referring to FIG. 19, the memory card 7300 includes an interface unit 7310, a controller 7320, and a semiconductor memory device 7330. The semiconductor memory device 7330 is a nonvolatile memory device in FIG. 14.

The interface unit 7310 provides an interface between the memory card 7300 and a host (not shown). The interface unit 7310 includes a data exchange protocol corresponding to the host to interface with the host. The interface unit 7310 can be configured to communicate with the host through one of various interface protocols such as universal serial bus (USB), multi-media card (MMC), peripheral component interconnect-express (PCI-E), serial-attached SCSI (SAS), serial advanced technology attachment (SATA), parallel advanced technology attachment (PATA), small computer system interface (SCSI), enhanced small disk interface (ESDI), and integrated drive electronics (IDE).

The controller 7320 receives data and an address provided from the outside through the interface unit 7310. The controller 7320 accesses the semiconductor memory device 7330 by referring to the data and the address provided from the host. The controller 7320 can transmit data read from the semiconductor memory device 7330 through the interface 7310 to the host. The controller 7320 can include a buffer memory 7321.

Write data provided from the host or data read from the semiconductor memory device 7330 are temporarily stored in the buffer memory 7321. When there is a read request of the host, if data existing in the semiconductor memory device 7330 is cached, the buffer memory 7321 supports a cache function of directly providing the cached data to the host. In general, a data transmission speed using a bus format of the host (for example, SATA or SAS) is much higher than a transmission speed of a memory channel of the memory card 7300. That is, if an interface speed of the host is much high, performance degradation, which occurs due to a speed difference, can be minimized by using the buffer memory 7321.

The semiconductor memory device 7330 is provided as a storage medium of the memory card 7300. For example, the semiconductor memory device 7330 can be a resistive memory device. Alternatively, the semiconductor memory device 7330 can be a NAND flash memory having a large storage capacity. The semiconductor memory device 7330 can include a plurality of memory devices. In this case, each of the semiconductor devices is connected to the controller 7320 in units of channels. The semiconductor memory device 7330, which is a storage medium, can be a phase change random access memory (PRAM), a magnetoresistive random access memory (MRAM), a resistive random access memory (ReRAM), a ferroelectric random access memory (FRAM), or a NOR flash memory, and can be applied to a memory system including different types of memory devices. Also, a method of processing fuse data according to an embodiment of the inventive concepts can be applied to the memory card 7300. For example, when the semiconductor memory device 7330 includes a fuse array and the memory card 7300 starts operating, an operating environment of the semiconductor memory device 7330 can be set by reading a plurality of pieces of information stored in the fuse array.

Figure 20:
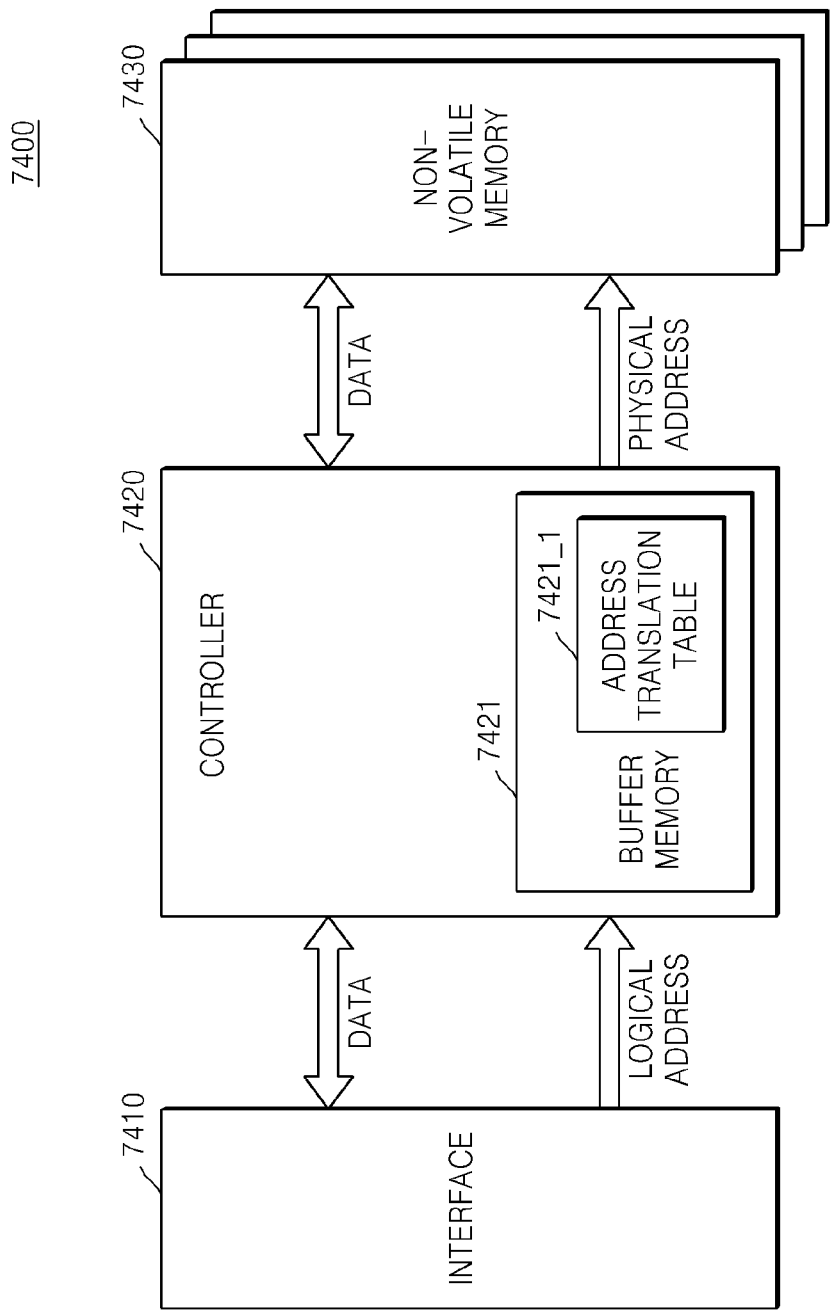
FIG. 20 is a block diagram illustrating an application of a memory card, according to another embodiment of the inventive concepts.

FIG. 20 is a block diagram illustrating a memory card 7400, in accordance with an embodiment. The memory card 7400 includes an interface unit 7410, a controller 7420, and a semiconductor memory device 7430. The interface unit 7410 and the semiconductor memory device 7430 are substantially the same as those of FIG. 19 in terms of configuration, and thus a detailed explanation thereof is not provided.

The controller 7420 includes a buffer memory 7421 including an address translation table 7421_1. The controller 7420 converts a logical address provided from the interface unit 7410 into a physical address by referring to the address translation table 7421_1. The controller 7420 can access the semiconductor memory device 7430 by referring to the physical address. The memory cards 7300 and 7400 illustrated in FIGS. 19 and 20 can be installed in an information processing apparatus such as a digital camera, a portable media player (PMP), a mobile phone, or a notebook computer. The memory cards 7300 and 7400 can be multi media cards (MMCs), secure digital (SD) cards, micro SD cards, memory stick cards, identification (ID) cards, personal computer memory card international association (PCMCIA) cards, chip cards, USB cards, smart cards, or compact flash (CF) cards.

Figure 21:
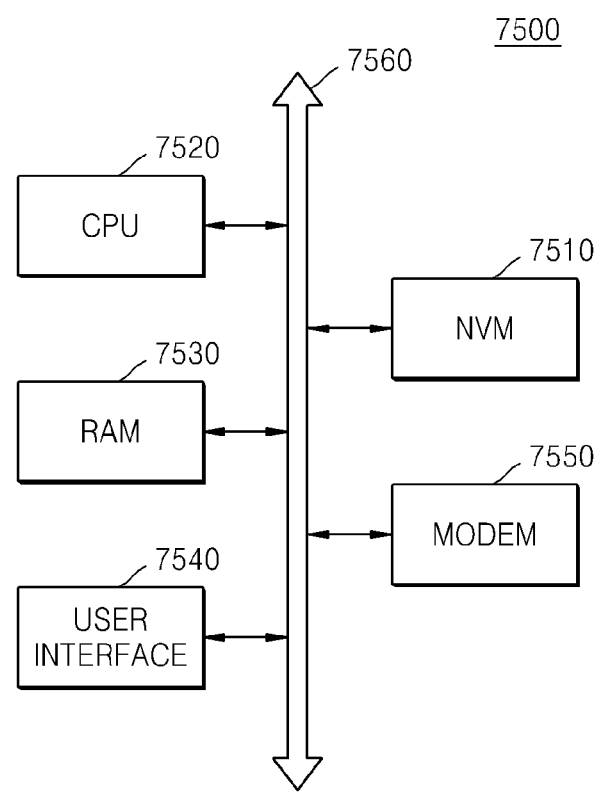
FIG. 21 is a block diagram illustrating a computing system including a memory device, according to an embodiment of the inventive concepts.

FIG. 21 is a block diagram illustrating a computing system 7500 including a memory device or a memory system, according to an embodiment of the inventive concepts. The computing system 7500 includes a microprocessor 7520 electrically connected to a RAM 7530, a user interface 7540, a modem 7550 such as a baseband chipset, and a memory system 7510 via a system bus 7560.

The memory system 7510 or the RAM 7530, which is a device for storing or outputting data, includes various logic circuits therein. If the computing system 7500 is a mobile device, a battery (not shown) for supplying an operating voltage of the computing system 7500 can be additionally provided. Although not shown in FIG. 21, it would have been obvious to one of ordinary skill in the art that an application chipset, a camera image processor (CIP), a mobile DRAM, and so on can be further provided to the computing system 7500. The memory system 7510 can constitute, for example, a solid state drive/disk (SSD) using a nonvolatile memory to store data. Alternatively, the memory system 7510 can be provided to a fusion flash memory, for example, a memory obtained by combining an SRAM buffer, a NAND flash memory, and a NOR interface logic.

A semiconductor device according to an embodiment can be applied to some of components included in the computing system 7500. When the computing system 7500 is initiated, the above embodiments of the inventive concepts can be used to set an operating environment of the memory system 7510 or the RAM 7530. Each of the memory system 7510 and the RAM 7530 includes a fuse array, and when the memory system 7510 or the RAM 7530 is initially driven, information stored in the fuse array is read and is used to set an operating environment. A semiconductor device and/or system according to the inventive concepts can be installed by using various types of packages. For example, the semiconductor device and/or system can be installed by using packages such as, but not limited to, a package on package (PoP), a ball grid array (BGA), a chip scale package (CSP), a plastic leaded chip carrier (PLCC), a plastic dual in-line package (PDIP), a die in waffle pack, a die in wafer form, a chip on board (COB), a ceramic dual in-line package (CERDIP), a plastic metric quad flat pack (MQEP), a thin quad flatpack (TQFP), a small outline integrated circuit (SOIC), a shrink small outline package (SSOP), a thin small outline package (TSOP), a system in package (SIP), a multi chip package (MCP), a wafer-level fabricated package (WFP), and a wafer-level processed stack package (WSP).

While the inventive concepts has been particularly shown and described with reference to exemplary embodiments thereof, it will be understood that various changes in form and details can be made therein without departing from the spirit and scope of the following claims.

What is claimed is:
1. A semiconductor device comprising:
a fuse array that comprises a first portion of fuses and a second portion of fuses;
a first group of sense amplifier circuits that senses information stored in the first portion of fuses in the fuse array and outputs a first group of fuse data;
a second group of sense amplifier circuits that senses information stored in the second portion of fuses in the fuse array and outputs a second group of fuse data;
a first register unit including a first group of registers that receives and transfers the first group of fuse data in response to a first transfer clock and a second group of registers that receives and transfers the second group of fuse data in response to a second transfer clock;
a multiplexer that selectively outputs the first and second group of fuse data; and
a second register unit that receives the fuse data from the multiplexer in response to a third transfer clock.

2. The semiconductor device of claim 1, wherein the fuse array comprises m rows and n columns, wherein the first register unit comprises a*n registers and stores fuse data of a rows of the fuse array (m, n, and a are each an integer equal to or greater than 1), and wherein fuse data stored in one row of the a rows is output in parallel to the first register unit.

3. The semiconductor device of claim 2, wherein the second register unit comprises m*n registers and stores the fuse data of the m rows of the fuse array.

4. The semiconductor device of claim 1, wherein the fuse array includes antifuses, and each antifuse comprises one fuse transistor connected to a high voltage and one select transistor connected to a word line and a bit line, and wherein it is determined whether each of the antifuses is programmed according to voltage levels of at least one of the high voltage, the word line, and the bit line.

5. The semiconductor device of claim 1, wherein the semiconductor device further comprises a cell region in which a memory cell array is disposed and a peri region in which one or more peripheral circuits are positioned, and wherein the fuse array is positioned at the peri region and at least one register of the second register unit is positioned at the cell region.

6. The semiconductor device of claim 1, wherein when the semiconductor device is initially driven, a read operation of the fuse array is initiated by sensing whether a level of an internal voltage reaches a threshold value.

7. The semiconductor device of claim 1, wherein the fuse array comprises a plurality of rows and columns, and wherein the semiconductor device further comprises an address generating unit that generates a row address for driving rows of the fuse array, wherein one or more rows of the fuse array is masked to disable a corresponding row address.

8. The semiconductor device of claim 1, further comprising a masking circuit that is disposed to correspond to one or more registers of the second register unit, wherein the fuse data is prevented from being provided to the one or more registers while the masking circuits are enabled.

9. A method of operating a semiconductor device comprising a fuse array, wherein the fuse array comprises a first portion of fuses and a second portion of fuses, the method comprising:
sensing, in a first group of sense amplifier circuits, information stored in the first portion of fuses in the fuse array for outputting a first group of fuse data;
sensing, in a second group of sense amplifier circuits, information stored in the second portion of fuses in the fuse array for outputting a second group of fuse data;
storing the first group of fuse data in a first group of registers of a first register unit;
transmitting the first group of fuse data stored in the first group of registers in response to a first transfer clock to a multiplexer and the second group of fuse data stored in the second group of registers to a second transfer clock to the multiplexer;

selectively outputting, by the multiplexer, the first and second group of fuse data to a second register unit; and setting an operating environment of the semiconductor device by processing the fuse data stored in the second register unit.

10. The method of claim 9, further comprising:

supplying power to the semiconductor device; and detecting a level of an internal voltage of the semiconductor device, wherein when the level of the internal voltage reaches a threshold value, the reading of the information is initiated.

11. The method of claim 9, wherein the fuse array comprises m rows and n columns, wherein the first register unit comprises a*n registers and stores fuse data of a rows of the fuse array, and wherein the second register unit comprises m*n registers and stores fuse data of the rows of the fuse array (where m, n, and a are each an integer equal to or greater than 1).

12. The method of claim 9, wherein the fuse array comprises a plurality of rows and columns, and further comprising generating a plurality of row addresses in order to drive the rows of the fuse array, wherein at least some of the plurality of row addresses are disabled in response to preset masking information.

13. The method of claim 9, wherein the fuse array comprises a plurality of antifuses positioned in an array.

* * * * *